US006603077B2

United States Patent
Hirai

(10) Patent No.: US 6,603,077 B2
(45) Date of Patent: Aug. 5, 2003

(54) CABLE CONNECTION STRUCTURE AND ELECTRONIC APPARATUS HAVING THE SAME

(75) Inventor: Koji Hirai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/014,350

(22) Filed: Dec. 14, 2001

(65) Prior Publication Data

US 2002/0179313 A1 Dec. 5, 2002

(30) Foreign Application Priority Data

Dec. 22, 2000 (JP) ...................................... 2000-390991
Dec. 5, 2001 (JP) ...................................... 2001-371329

(51) Int. Cl.$^7$ ................................................ H02G 7/00
(52) U.S. Cl. ....................................................... 174/78
(58) Field of Search ................................ 174/78, 84 C, 174/88 C; 439/98, 99

(56) References Cited

U.S. PATENT DOCUMENTS 6,297,447 B1 * 10/2001 Burnett et al. .......... 174/40 CC

FOREIGN PATENT DOCUMENTS

| JP | 06-176823 | 6/1994 |
| JP | 09-022624 | 1/1997 |
| JP | 10-027987 | 1/1998 |

* cited by examiner

Primary Examiner—Chau N. Nguyen
(74) Attorney, Agent, or Firm—Fitzpatrick, Cella, Harper & Scinto

(57) ABSTRACT

A cable connection structure is provided, which has circuit boards of an electronic apparatus connected to each other by a shielded cable for transmission of signals, which is capable of effectively suppressing radiated electromagnetic waves due to resonance from the shielded cable and the circuit boards in an inexpensive and simple manner. At least two connectors are provided on at least two circuit boards, respectively, and a shielded cable connects the circuit boards to each other via the connectors. The shielded cable has a shielding conductor as a covering. The shielding conductor is conductively connected to the metal casing at a position spaced from a position where the shielding conductor and one of the connectors are connected to each other by a distance which is less than a value obtained by multiplying ½ of a wavelength at an upper limit frequency of relevant radiated electromagnetic waves emitted from the shielded cable or ½ of a wavelength at a regulated upper limit frequency of radiated electromagnetic waves by a wavelength reduction ratio at the shielding conductor.

6 Claims, 31 Drawing Sheets

CABLE CONNECTION STRUCTURE AND ELECTRONIC APPARATUS HAVING THE SAME

BACKGROUND OF THE INVENTION

1. Field of the Invention

The present invention relates to a cable connection structure and an electronic apparatus having the same, and more particularly to a cable connection structure which can be suitably applied to cables for signal transmission between circuit boards in an electronic apparatus, and to an electronic apparatus to which such a cable structure is applied.

2. Description of the Related Art

In recent years, with the development of electronic apparatus exhibiting higher speed and better performance, the influence of radiated electromagnetic waves from one electronic apparatus upon other electronic apparatuses has become a serious problem. The influence of radiated electromagnetic waves from one electronic apparatus upon other electronic apparatuses is called EMI (Electro Magnetic Interference), and causes interference to reception of radio devices and communication devices in particular, or malfunctioning of electronic apparatuses. To cope with this problem, various countries have prescribed that the frequency range of 30 MHz to 1 GHz or the range of 30 MHz to 2 GHz is a frequency range that can cause a problem of radiated electromagnetic waves, and control of the amount of radiation of electromagnetic waves in the above frequency range is now strictly carried out. Manufacturers of electronic apparatuses have to design and manufacture their products so as to comply with these regulations.

Radiation sources of radiated electromagnetic waves from inside electronic apparatuses include circuit boards, cables connected to circuit boards, etc. In particular, cables that connect circuit boards for signal transmission have become more likely to cause a problem as radiation sources of radiated electromagnetic waves as the signal transmission rate has become higher in recent years. Conventionally, to suppress such radiated electromagnetic waves, shielded cables covered with shielding conductors have been used, or a ferrite core has been mounted on a cable to suppress such radiated electromagnetic waves.

FIG. 35 is a view showing a conventional example of a cable connection structure for suppression of radiated electromagnetic waves. FIG. 35 shows an example of a case in which two circuit boards are connected to each other by a cable for signal transmission in an electronic apparatus. The circuit boards 1401, 1402 are conductively connected via metal spacers 1404 to a metal casing 1403 in the electronic apparatus. The circuit boards 1401, 1402 are connected to each other via a cable 1405 so that signals are transmitted via the cable 1405.

To suppress electromagnetic wave radiated from this cable 1405, a shielded cable has been conventionally used as the cable 1405. Alternatively, a ferrite core 1406 may be mounted on the cable 1405 as a part for suppressing radiated electromagnetic waves. As other methods for suppressing radiated electromagnetic waves, it can be envisaged that a magnetic material is mounted on a shielding conductor of a shielded cable as disclosed in Japanese Laid-Open Patent Publication (Kokai) No. 06-176823, a resistor is inserted in a shielding conductor of a shielded cable as disclosed in Japanese Laid-Open Patent Publication (Kokai) No. 09-22624, or a dielectric material is mounted a cable conductor of a shielded cable as disclosed in Japanese Laid-Open Patent Publication (Kokai) No. 10-27987.

However, there has been the following problems with the above described prior art. That is, in the case of signal transmission via a cable between circuit boards in an electronic apparatus, a resonance may arise due to the connection structure of the cable and circuit boards, and at the resonance frequency, radiated electromagnetic waves are efficiently radiated from the cable and the circuit boards. This resonance arises even if the cable is a shielded cable. Even if a shielded cable is used, radiated electromagnetic waves are radiated with a degree of intensity exceeding a predetermined regulated value. The electromagnetic wave radiation from the shielded cable is caused by a high frequency current flowing in the outer skin of the shielding conductor of the shielded cable. At the resonance frequency, in particular, the outer skin of the shielding conductor has a low impedance, and a large high frequency current flows in the outer skin, resulting in intense electromagnetic waves being generated.

The above-mentioned high frequency current may be suppressed, for example, by mounting a ferrite core on the shielded cable as shown in FIG. 35 to thereby increase the impedance of the outer skin of the shielding conductor. This effect of a ferrite core, however, is only effective in a low frequency region of about 300 MHz or below. Thus, in the frequency region exceeding 300 MHz up to 1 GHz or 2 GHz, in which the amount of electromagnetic wave radiation is regulated, a large high frequency current flows in the outer skin of the shielding conductor, and hence radiated electromagnetic waves cannot be suppressed.

As regards the magnetic material disclosed in Japanese Laid-Open Patent Publication (Kokai) No. 06-176823, the effect of the magnetic material is small in the high frequency region exceeding 300 MHz in the same manner as is the case with the above described ferrite core. As regards the resistor disclosed in Japanese Laid-Open Patent Publication (Kokai) No. 09-22624, although the insertion of the resistor into the shielding conductor has an effect in the whole frequency range, the effect is small, and is insufficient to suppress radiated electromagnetic waves in the frequency range where intense radiated electromagnetic waves are generated. Increasing the resistance value of the resistor may enhance the suppression effect, but it also reduces the return current flowing in the inner skin of the shielding conductor, and is therefore impracticable. As regards the dielectric material disclosed in Japanese Laid-Open Patent Publication (Kokai) No. 10-27987, the lower the frequency of the radiated electromagnetic waves, the longer the part has to be formed, which leads to a problem of limited mounting space.

According to the above described methods using a ferrite core, a resistor, and a dielectric material, a new component has to be prepared for the reduction of radiated electromagnetic waves, resulting in increased costs of the electronic apparatuses.

SUMMARY OF THE INVENTION

It is an object of the present invention to provide a cable connection structure having circuit boards of an electronic apparatus connected to each other by a shielded cable for transmission of signals, which is capable of effectively suppressing radiated electromagnetic waves due to resonance from the shielded cable and the circuit boards in an inexpensive and simple manner, and an electronic apparatus having the cable connection structure.

To attain the above object, a first aspect of the present invention provides a cable connection structure for use in an electronic apparatus, comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance which is less than a value obtained by multiplying ½ of a wavelength at an upper limit frequency of relevant radiated electromagnetic waves emitted from the shielded cable or ½ of a wavelength at a regulated upper limit frequency of radiated electromagnetic waves by a wavelength reduction ratio at the shielding conductor.

To attain the above object, the first aspect of the present invention further provides a cable connection structure for use in an electronic apparatus, comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance which is set to a value obtained by multiplying $1/32$ to $7/16$ of a wavelength at an upper limit frequency of relevant radiated electromagnetic waves emitted from the shielded cable or $1/32$ to $7/16$ of a wavelength at a regulated upper limit frequency of radiated electromagnetic waves by a wavelength reduction ratio at the shielding conductor.

To attain the above object, the first aspect of the present invention also provides a cable connection structure for use in an electronic apparatus, comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance within a range of 1 cm to 13 cm.

Preferably, the cable connection structure according to the present invention further comprises adjusting means for adjusting a position of the shielded cable within a range which is set to a value obtained by multiplying $1/32$ to $7/16$ of the wavelength at the upper limit frequency of relevant radiated electromagnetic waves emitted from the shielded cable or $1/32$ to $7/16$ of the wavelength at a regulated upper limit frequency of radiated electromagnetic waves by the wavelength reduction ratio at the shielding conductor from the position where the shielding conductor and the one of the connectors are connected to each other.

In a preferred embodiment of the present invention, the circuit boards comprise a driver board that transmits signals, and a receiver board that receives signals, and wherein the shielding conductor is conductively connected to the metal casing at a position spaced from the position where the shielding conductor and one of the connectors which is provided on the driver board are connected to each other by a distance which is set to a value obtained by multiplying $1/32$ to $7/16$ of a wavelength at an upper limit frequency of relevant radiated electromagnetic waves emitted from the shielded cable or $1/32$ to $7/16$ of a wavelength at a regulated upper limit frequency of radiated electromagnetic waves by a wavelength reduction ratio at the shielding conductor.

More preferably, a characteristic impedance of a first portion of the shielding conductor relative to the metal casing from the position where the shielding conductor is conductively connected to the metal casing to the position where the shielding conductor and the one of the connectors provided on the driver board are connected to each other is greater than a characteristic impedance of a second portion of the shielding conductor relative to the metal casing from the position where the shielding conductor is conductively connected to the metal casing to a position where the shielding conductor is connected to another one of the connectors which is provided on the receiver board.

Also preferably, a distance between the shielding conductor and the metal casing at at least part of an area from the position where the shielding conductor is conductively connected to the metal casing to the position where the shielding conductor and the one of the connectors provided on the driver board are connected to each other is greater than a distance between the shielding conductor and the metal casing at other areas than the at least part of the area.

Preferably, the cable connection structure according to the present invention further comprises a resistance component serially connected between the shielding conductor and the metal casing at the position where the shielding conductor is conductively connected to the metal casing.

In a preferred embodiment of the present invention, the shielded cable comprises a multiconductor shielded cable for simultaneously transmitting a plurality of signals.

More preferably, the cable connection structure according to the present invention further comprises a ferrite core mounted on the shielded cable.

Also preferably, the cable connection structure according to the present invention further comprises a conductive connection member that conductively connects the shielding conductor of the shielded cable and the metal casing to each other, and a ferrite core mounted on the conductive connection member.

The shielded cable may have a circular cross section, or has a sheet-like shape.

Preferably, the shielded cable having a sheet-like shape includes a signal line, and the shielding conductor of the shielded cable entirely wraps the signal line.

Alternatively, the shielding conductor of the shielded cable having a sheet-like shape is provided only on one side of the shielded cable.

The cable connection structure according to the first aspect of the present invention employs a cable connection construction that circuit boards of an electronic apparatus are connected with a shielded cable for transmission of signals, and is designed such that generation of electromagnetic waves due to resonance from the shielded cable or the circuit boards can be effectively suppressed in an inexpensive and simple manner.

To attain the above object, a second aspect of the present invention provides an electronic apparatus having a metal casing, and a cable connection structure comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance which is less than a value obtained by multiplying ½ of a wavelength at an upper limit frequency of relevant radiated electromagnetic waves emitted from the shielded cable or ½ of a wavelength at a regulated upper limit frequency of radiated electromagnetic waves by a wavelength reduction ratio at the shielding conductor.

To attain the above object, the second aspect of the present invention further provides an electronic apparatus having a metal casing, and a cable connection structure comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance which is set to a value obtained by multiplying $\frac{1}{32}$ to $\frac{7}{16}$ of a wavelength at an upper limit frequency of relevant radiated electromagnetic waves emitted from the shielded cable or $\frac{1}{32}$ to $\frac{7}{16}$ of a wavelength at a regulated upper limit frequency of radiated electromagnetic waves by a wavelength reduction ratio at the shielding conductor.

To attain the above object, the second aspect of the present invention also provides an electronic apparatus having a metal casing, and a cable connection structure comprising at least two circuit boards, at least two connectors provided on the circuit boards, respectively, and a shielded cable connecting the circuit boards to each other via the connectors, the shielded cable having a shielding conductor as a covering, wherein the shielding conductor is conductively connected to the metal casing at a position spaced from a position where the shielding conductor and one of the connectors are connected to each other by a distance within a range of 1 cm to 13 cm.

The electronic apparatus according to the second aspect of the present invention employs a cable connection construction that circuit boards of an electronic apparatus are connected to each other by a shielded cable for transmission of signals, and is designed such that generation of electromagnetic waves due to resonance from the shielded cable or the circuit boards can be effectively suppressed in an inexpensive and simple manner.

The above and other objects of the invention will become more apparent from the following detailed description taken in conjunction with the accompanying drawings.

DETAILED DESCRIPTION OF PREFERRED EMBODIMENTS

Before describing embodiments of the present invention, a description will be given of a mechanism in which a high frequency current due to resonance flows in the outer skin of a shielding conductor in an electronic apparatus that has circuit boards connected to each other by a shielded cable, so that radiated electromagnetic waves are generated.

Figure 23:
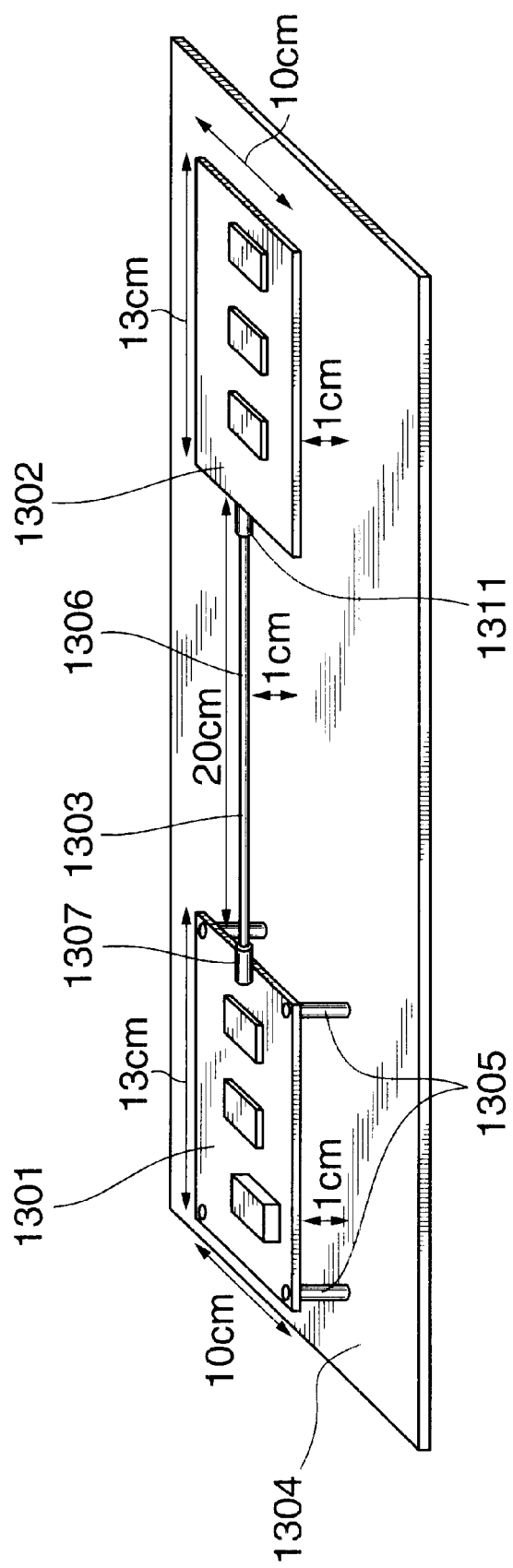
FIG. 23 is a perspective view showing a cable connection structure of an electronic apparatus according to the prior art.

FIG. 23 shows an example of a shielded cable connection structure, which is useful in simply explaining the mechanism. In this structure, a driver circuit board 1301 as a signal transmitting side (hereinafter referred to as "driver board") and a receiver board 1302 as a signal receiving circuit board (hereinafter referred to as "receiver board") are connected to each other by a shielded cable 1303 such that signals are transmitted therebetween. A shielding conductor 1306 that covers the shielded cable 1303 is connected to both the ground of the driver board 1301 and the ground of the receiver board 1302. A metal casing 1304 is located below the driver board 1301, the cable 1303, and the receiver board 1302, and only the driver board 1301 is grounded by a metal spacer 1305.

The shielded cable 1303 is 20 cm in length, and the cable conductor 1306 is not covered with a dielectric material. The distance between the shielded cable 1303, the driver board 1301, and the receiver board 1302 and the metal casing 1304 is 1 cm. Each of the driver board 1301 and the receiver board 1302 has a size of 13 cm×10 cm, and the cable 1303 is connected via connectors 1307 and 1311 to the edges of the boards 1301, 1302 that are 10 cm in length.

Usually, a signal current from the driver board 1301 flows through the shielded cable 1303 to the receiver board 1302, and then a return current flows via the connector 1311 and through the inner skin of the shielding conductor 1306 to the driver board 1301. No radiated electromagnetic wave is emitted by the signal current flowing through the inner skin of the shielding conductor 1306. However, when the input impedance of the outer skin of the shielding conductor 1306 and the receiver board 1302 relative to the metal casing 1304 at the connector 1307 is low, the return current flows via the connector 1307 into the outer skin of the shielding conductor 1306. This causes a high frequency current to flow through the outer skin of the shielding conductor 1306, which leads to emission of intense radiated electromagnetic waves.

Input impedance has resonance frequencies, that is, it has a characteristic of an alternation of very high impedance and very low impedance at specific frequencies. Therefore, at frequencies at which the input impedance of the outer skin of the shielding conductor 1306 relative to the metal casing 1304 at the connector 1307 is very low, the return current intensely flows via the connector 1307 into the outer skin of the shielding conductor 1306, thus leading to generation of intense radiated electromagnetic waves from the outer skin of the shielding conductor 1306 and the receiver board 1302. Further, a common mode current which is generated by driving of ICs or the like on the driver board 1301 and the receiver board 1302 intensely flows via the connector 1307 into the outer skin of the shielding conductor 1306 that has a low impedance due to resonance thereof, again leading to generation of intense radiated electromagnetic waves from the outer skin of the shielding conductor 1306 and the receiver board 1302.

This input impedance characteristic can be explained by referring to a transmission line model using the characteristic impedance of the outer skin of the shielding conductor 1306 relative to the metal casing 1304, and the characteristic impedance of the ground of the receiver board 1302 relative to the metal casing 1304 (see Symposium of the 14th Scientific Meeting on Electronic Packaging, 15B-12, March 2000). The transmission line model based on the cable connection structure shown in FIG. 23 can be represented as shown in FIG. 24.

Figure 24:
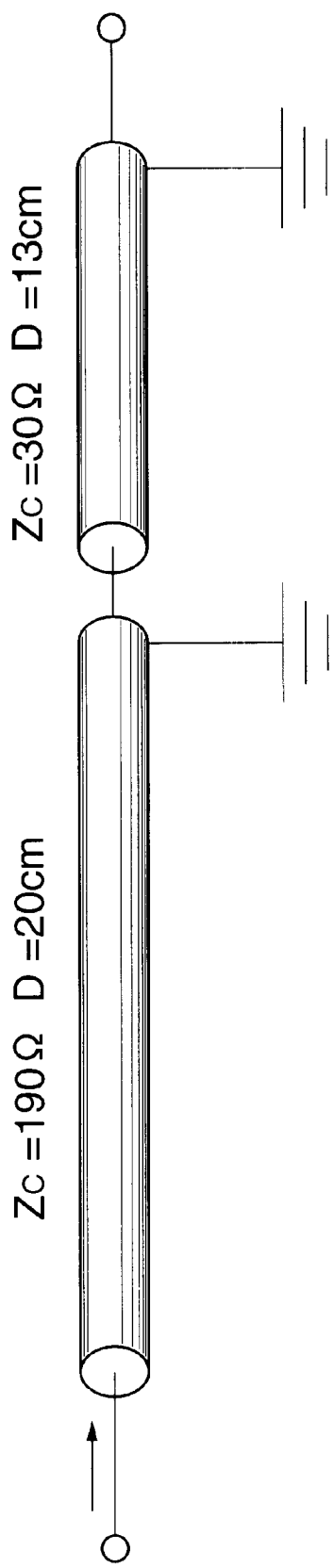
FIG. 24 is a schematic view showing a transmission line model according to the prior art.

As shown in FIG. 24, the characteristic impedance Zc of the outer skin of the shielding conductor 1306 relative to the metal casing 1304 is 190 Ω, while the characteristic impedance Zc of the ground of the receiver board 1302 relative to the metal casing 1304 is 30 Ω.

Figure 25:
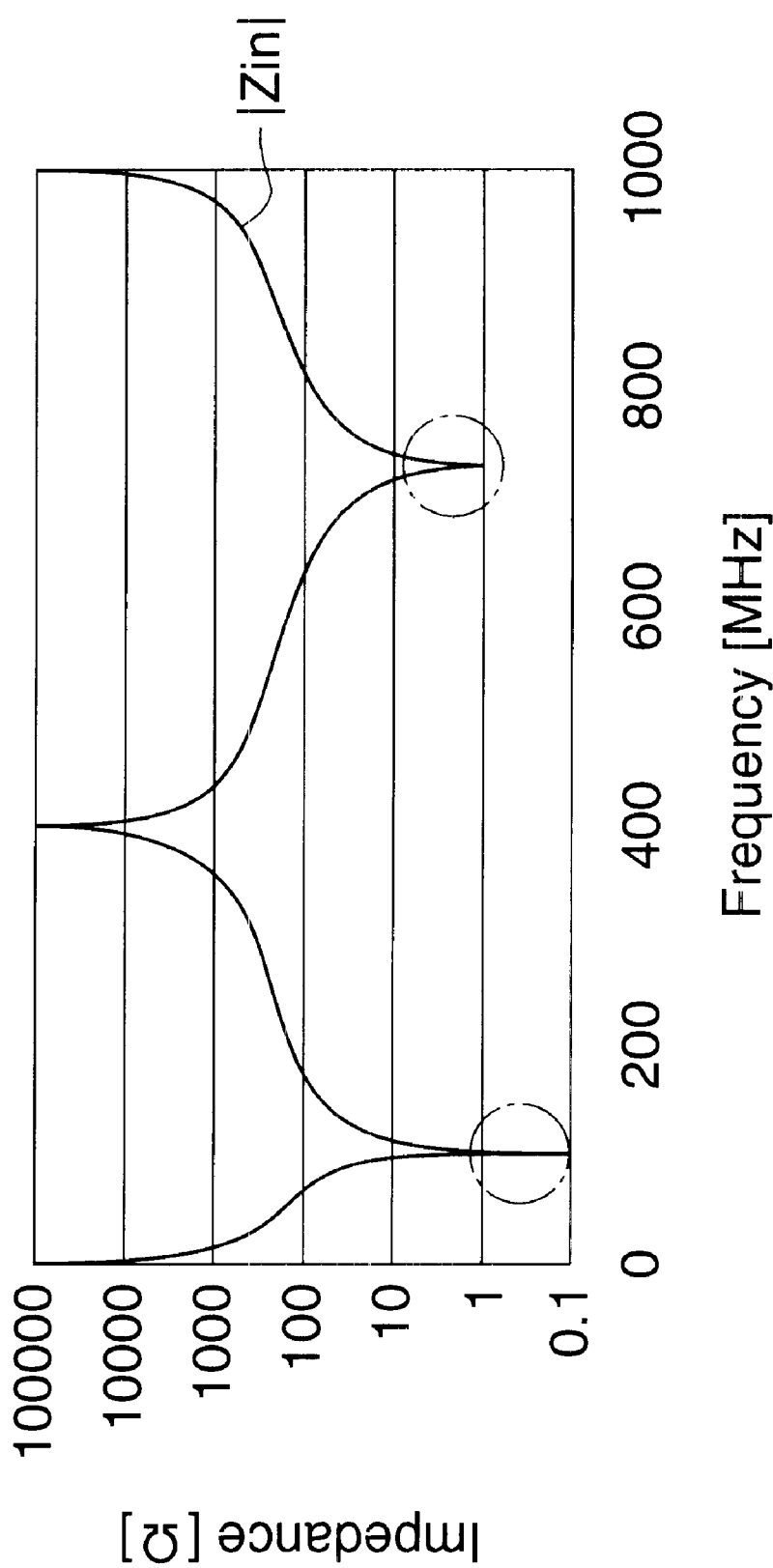
FIG. 25 is a graph useful in explaining an input impedance characteristic according to the prior art.
Figure 26:
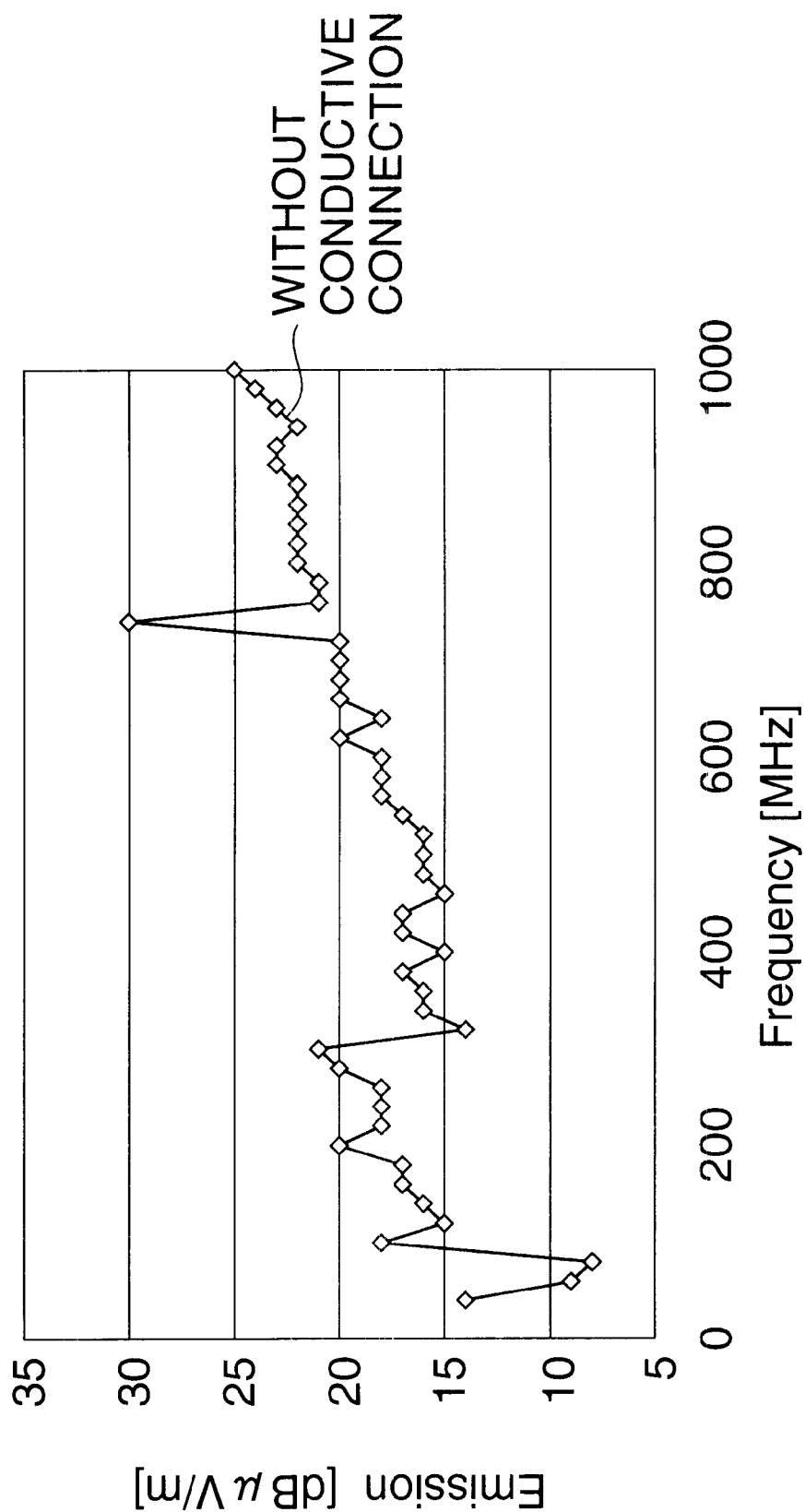
FIG. 26 is a graph useful in explaining the amount of radiated electromagnetic waves relative to the frequency according to the prior art.

According to the above-mentioned characteristic impedance Zc, the input impedance characteristics of the outer skin of the shielding conductor 1306 and the receiver board 1302 relative to the metal casing 1304 in the frequency range of the emitted radiated electromagnetic waves concerned can be represented as shown in FIG. 25. Amounts of radiated electromagnetic waves generated in the frequency range shown in FIG. 25 are depicted in FIG. 26. As shown in FIG. 25, according to the transmission line model of FIG. 24, the value of the input impedance becomes low due to resonance at frequencies around 110 MHz, and around 730 MHz. Therefore, at the frequencies around 110 MHz and around 730 MHz, high frequency current flows in the outer skin of the shielding conductor 1306, giving rise to peaks in the radiated electromagnetic waves as shown in FIG. 26.

Figure 27:
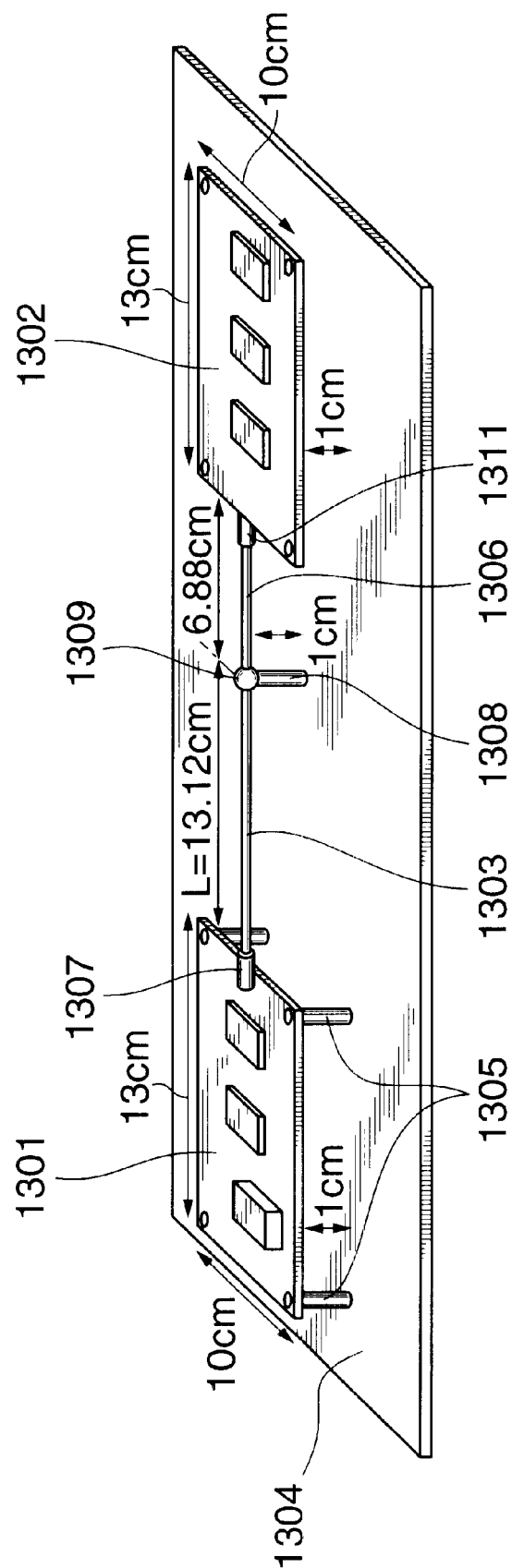
FIG. 27 is a perspective view showing a cable connection structure of an electronic apparatus, which is useful in explaining the operation of the present invention.

Next, the mechanism in which the radiated electromagnetic waves produced by the high frequency current generated in the cable can be suppressed by means of the cable connection structure in the electronic apparatus according to the present invention will be described. An example of cable connection structure in which the circuit boards are connected to each other by a shielded cable, is shown in FIG. 27. In FIG. 27, the same or similar elements as in FIG. 23 are denoted by the same reference numerals, and description thereof is omitted. The cable connection shown in FIG. 27 is the same as that in FIG. 23 except that the shielding conductor 1306 and the metal casing 1304 are conductively connected together by an conductive connection member 1308 at a connecting position 1309. The connecting position 1309 is located at a distance L from the connector 1307.

Figure 28:
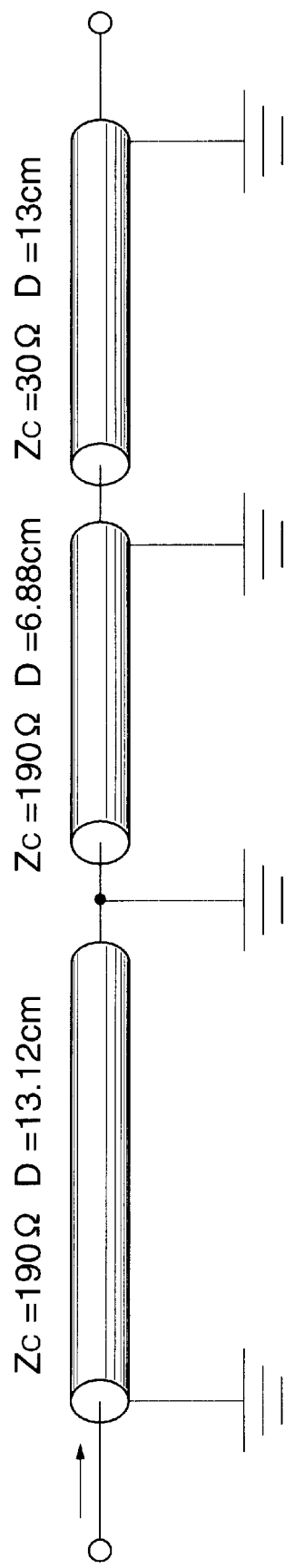
FIG. 28 is a schematic view showing a transmission line model, which is useful in explaining the operation of the present invention.

Here, as described above, the input impedance characteristic can be explained by means of a transmission line model using the characteristic impedance of the outer skin of the shielding conductor 1306 relative to the metal casing 1304, and the characteristic impedance of the ground of the receiver board 1302 relative to the metal casing 1304. The transmission line model of the exemplary connection structure as shown in FIG. 27 can be represented as shown in FIG. 28. In FIG. 28, the characteristic impedance Zc of a portion of the outer skin of the shielding conductor 1306 from the connector 1307 to the connecting position 1309 relative to the metal casing 1304 is 190 Ω, and the characteristic impedance Zc of a portion of the outer skin of the shielding conductor 1306 from the connecting position 1309 to the connector 1311 relative to the metal casing 1304 is 190 Ω. The characteristic impedance Zc of the receiver board 1302 relative to the metal casing 1304 is 30 Ω.

As regards the input impedance of the outer skin of the shielding conductor 1306 at the connector 1307, since the shielding conductor 1306 is grounded to the metal casing 1304 at the connecting position 1309, and can be regarded as a line having a short circuited end, only the characteristic impedance of the portion of the shielding conductor 1306 of the shielded cable from the connector 1307 to the connecting position 1309 relative to the metal casing 1304 and the length L from the connector 1307 to the connecting position 1309 need to be taken into account.

The absolute value of the input impedance |Zin| is predominantly $$|Zin|=|jZc \cdot \tan \beta L|,$$

where Zc represents the characteristic impedance of the outer skin of the shielding conductor 1306 relative to the metal casing 1304, β a phase constant, and j the imaginary unit $\sqrt{-1}$.

The phase constant β is expressed by the following equation:

$$\beta = \frac{2\pi \sqrt{\epsilon_{eff}}}{\lambda_0}$$

where $\lambda_0$ represents the wavelength of the electromagnetic wave in vacuum, $\epsilon_{eff}$ the effective dielectric constant of the medium and the air combined.

Here, the medium is a medium in the region where electromagnetic field coupling between the outer skin of the shielding conductor 1306 and the metal casing 1304 takes place. If the outer skin of the shielding conductor 1306 is not covered with a dielectric material, dielectric constant and permeability of a vacuum may be used. If it is covered by a medium such as a dielectric material, an effective dielectric constant of the air and the medium combined is used. In this case, the wavelength reduction ratio $\lambda/\lambda_0$ is expressed by the following equation:

$$\frac{\lambda}{\lambda_0} = \frac{1}{\sqrt{\epsilon_{eff}}}$$

Thus, the frequency characteristic of the absolute value of the input impedance |Zin| differs depending upon the presence or absence, kind, and thickness of a dielectric material at the outer skin of the shielding conductor 1306.

Therefore, the input impedance of the line having a short circuited end produces resonance if the following equation is satisfied:

$$L = \frac{\lambda_0}{2} \cdot \frac{1}{\sqrt{\epsilon_{eff}}}$$

where the input impedance has a minimal value. On the other hand, the input impedance produces antiresonance if the following equation is satisfied:

$$L = \frac{\lambda_0}{4} \cdot \frac{1}{\sqrt{\epsilon_{eff}}}$$

where the input impedance has a maximal value.

As described before, when the input impedance becomes lower, a return current intensely flows into the outer skin of the shielding conductor 1306 through the connector 1307 of the driver board 1301, and intense radiated electromagnetic waves are emitted from the outer skin of the shielding conductor 1306 and the receiver board 1302. Therefore, in order to prevent the intense radiated electromagnetic waves from being emitted due to the high frequency current flowing in the outer skin of the shielding conductor 1306 at the resonance frequency, it is necessary that at the upper limit frequency of the relevant radiated electromagnetic waves emitted from the shielded cable 1303, or in the frequency range not higher than the regulated upper limit frequency of the radiated electromagnetic waves, the input impedance $Z_{in}$ does not satisfy the following equation:

$$|Z_{in}|=|jZ_c \cdot \tan \pi|$$

To this end, it is only necessary that the length L from the position where the shielding conductor 1306 and the connector 1307 are connected to each other to the connecting position 1309 where the shielding conductor 1306 and the metal casing 1304 are conductively connected to each other by the conductive connection member 1308 should be less than a length obtained by multiplying ½ of the wavelength at the upper limit frequency of the relevant radiated electromagnetic waves emitted from the shielded cable 1303 or ½ of the wavelength at the regulated upper limit frequency of the radiated electromagnetic waves by the wavelength reduction ratio at the outer skin of the shielding conductor 1306.

Also, to realize a high input impedance over a frequency range as wide as possible, a relatively high input impedance in the vicinity of the frequency where the maximum input impedance defined by the following equation is obtained needs to be utilized efficiently:

$$|Z_{in}| = \left|jZ_c \cdot \tan\frac{\pi}{2}\right|$$

To this end, it is only necessary that the length L from the position where the shielding conductor 1306 and the connector 1307 are connected to each other to the connecting position 1309 where the shielding conductor 1306 and the metal casing 1304 are conductively connected to each other by the conductive connection member 1308 should be approximately equal to a length obtained by multiplying 1/32 to 7/16 of the wavelength at the upper limit frequency of the relevant radiated electromagnetic waves emitted from the shielded cable 1303 or 1/32 to 7/16 of the wavelength at the regulated upper limit frequency of the radiated electromagnetic waves by the wavelength reduction ratio at the outer skin of the shielding conductor 1306.

If the length L is under 1/32 of the upper limit wavelength or the regulated upper limit wavelength, the input impedance characteristic over the frequency range of the relevant radiated electromagnetic waves or the regulated frequency range of the radiated electromagnetic waves becomes generally lower, especially the input impedance characteristic in the low frequency region becomes drastically lower, so that the effect of suppression of the radiated electromagnetic waves is reduced. Besides, in this case, the conductive connection member 1308 needs to be located at a position near the connector 1307, so that the operation of connecting the shielding conductor 1306 to the metal casing 1304 becomes difficult to perform, and in some cases weak grounding may be achieved, or grounding may become impossible to perform.

If the length L is greater than 7/16 of the upper limit wavelength or the regulated upper limit wavelength, the length L becomes closer to 1/2 of the wavelength at the resonance frequency, so that the input impedance sharply decreases near the upper limit frequency of the relevant radiated electromagnetic waves or near the regulated upper limit frequency of the radiated electromagnetic waves. Therefore, a relatively high input impedance cannot be utilized efficiently, and hence radiated electromagnetic waves may be generated.

Next, the case of the example of the cable connection structure of FIG. 27 will be described more specifically using the transmission line model of FIG. 28, on the assumption that the regulated frequency range of the relevant radiated electromagnetic waves is 30 MHz to 1 GHz. Since the shielded cable 1303 is not covered with a dielectric material, the effective dielectric constant is 1 at the outer skin of the shielding conductor 1306 and the wavelength at the outer skin of the shielding conductor 1306 at the upper limit frequency of 1 GHZ is 30.0 cm as obtained from the following equation:

$$30 \times \frac{1}{\sqrt{1}} = 30.0$$

Accordingly, 7/16 of the wavelength is 13.12 cm, and 1/32 of the wavelength is 0.94 cm. Therefore, it is only necessary that the length L from the position where the shielding conductor 1306 and the connector 1307 are connected to each other to the connecting position 1309 where the shielding conductor 1306 and the metal casing 1304 are conductively connected together by the conductive connection member 1308 should be 0.94 cm or greater but not greater than 13.12 cm.

Figure 29:
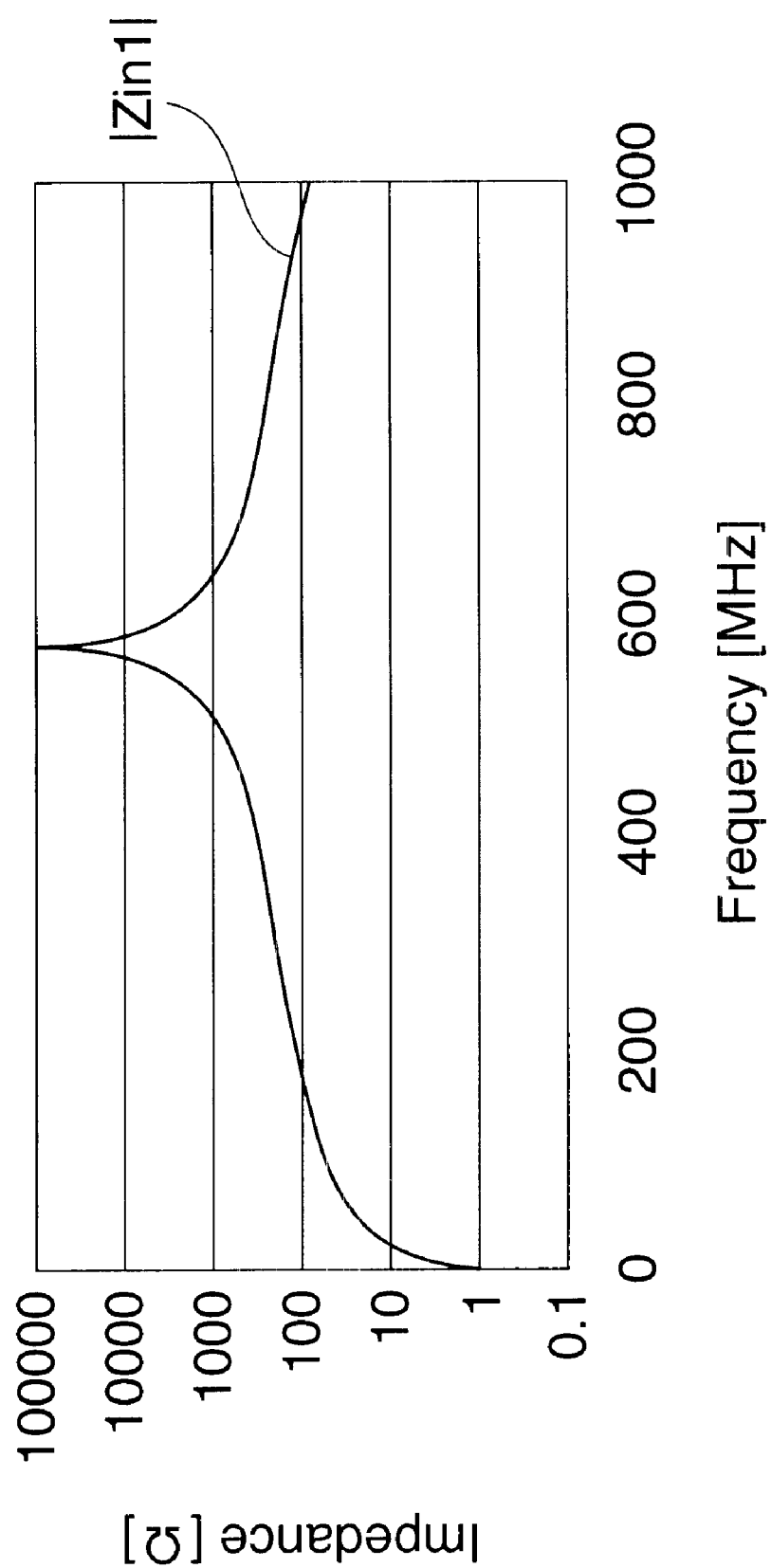
FIG. 29 is a graph showing an impedance characteristic, which is useful in explaining the operation of the present invention.
Figure 30:
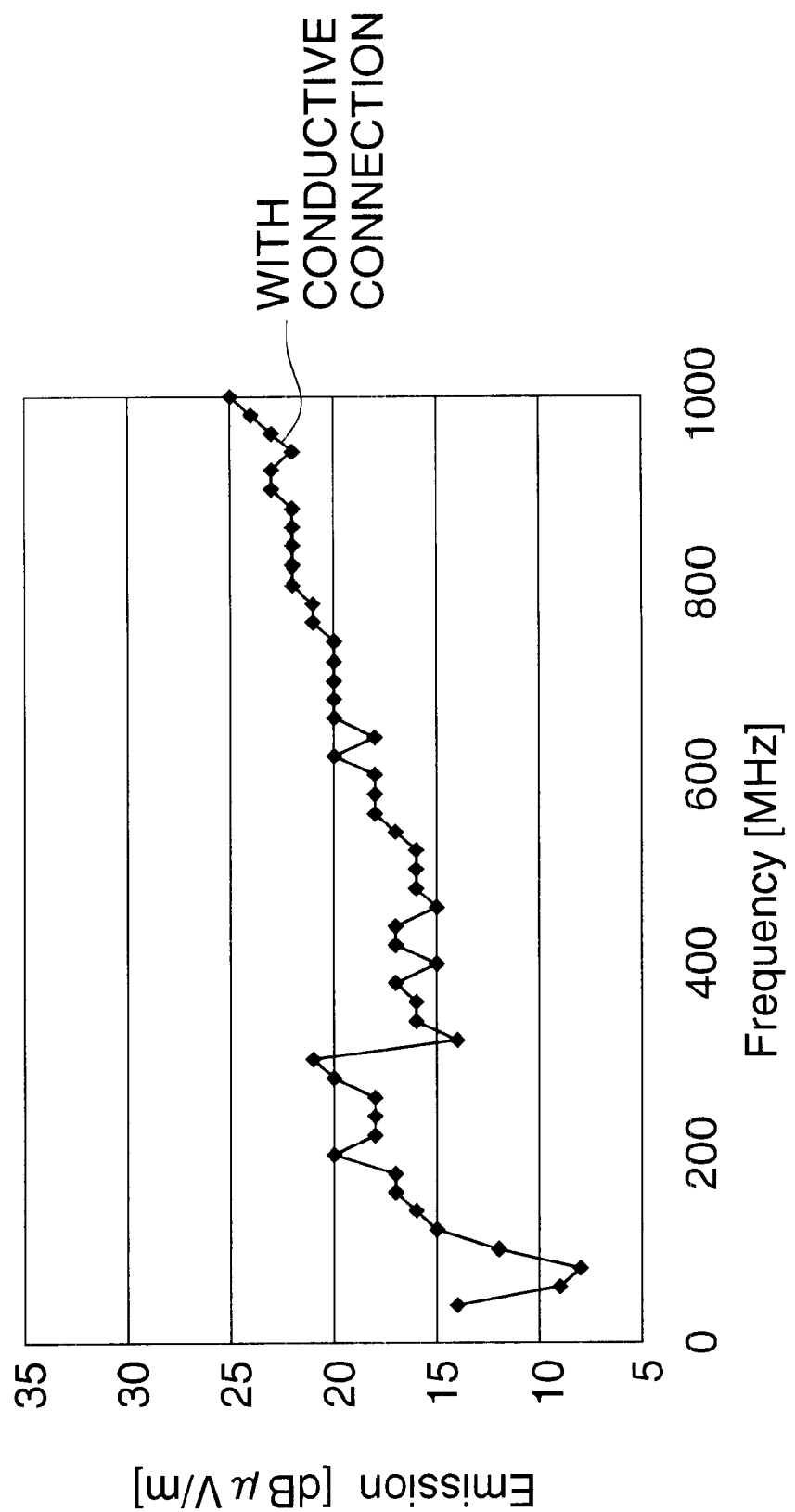
FIG. 30 is a graph showing radiated electromagnetic waves, which is useful in explaining the operation of the present invention.

FIG. 29 shows the input impedance characteristic of the outer skin of the shielding conductor 1306 relative to the metal casing 1304 with L=13.12 cm, as viewed from the connector 1307. FIG. 30 shows the amount of radiated electromagnetic waves in the frequency range shown in FIG. 29.

Figure 31:
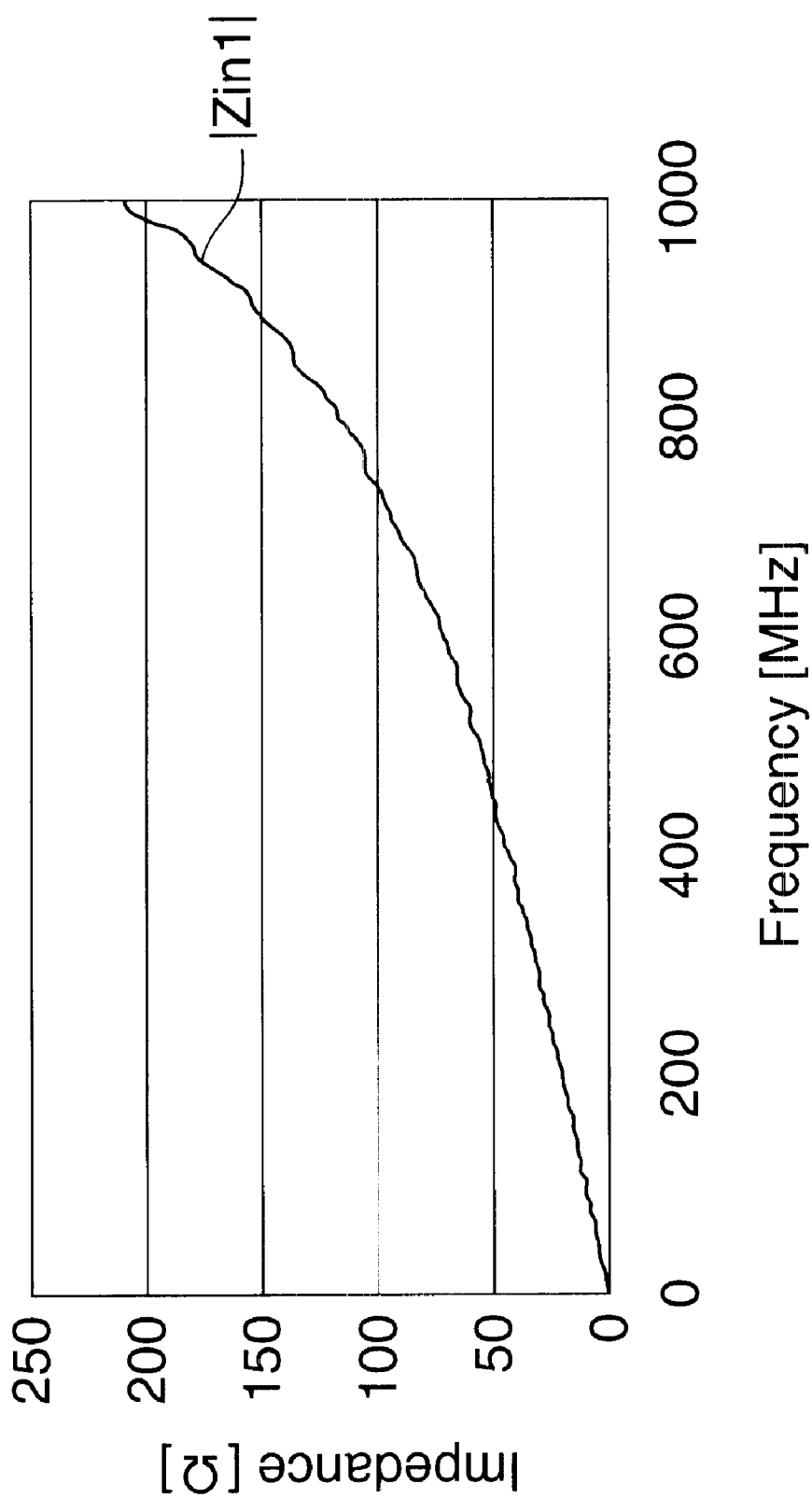
FIG. 31 is a graph showing an impedance characteristic, which is useful in explaining the operation of the present invention.

Further, FIG. 31 shows the input impedance characteristic of the outer skin of the shielding conductor 1306 relative to the metal casing 1304 with L=0.94 cm, as viewed from the connector 1307.

It can be learned from FIGS. 29 through 31 that by setting the connecting position 1309 where the shielding conductor 1306 and the metal casing 1304 are conductively connected together by the conductive connection member 1308 at a distance of 0.94 cm to 13.12 cm from the position where the shielding conductor 1306 and the connector 1307 are connected to each other, the input impedance of the outer skin of the shielding conductor 1306 at the connector 1307 relative to the metal casing 1304 does not assume any minimal value due to resonance in the frequency range of 30 MHz to 1 GHz. It can also be learned that the input impedance is maintained at high values over the entire regulated frequency range of the relevant radiated electromagnetic waves. Thus, in the above frequency range, no significant amount of radiated electromagnetic waves is generated.

If the distance between the shielding conductor 1306 and the metal casing 1304 at an area from the position where the shielding conductor 1306 and the connector 1307 are connected to each other to the connecting position 1309 where the shielding conductor 1306 and the metal casing 1304 are conductively connected together by the conductive connection member 1308, is small, the absolute value of the characteristic impedance Zc of the shielding conductor 1306 relative to the metal casing 1304 is low, and hence the input impedance |Zin| of the shielding conductor 1306 relative to the metal casing 1304 at the connector 1309 is also low. Also, as the characteristic impedance of the shielding conductor 1306 relative to the metal casing 1304 at the area from the position where the shielding conductor 1306 and the connector 1307 are connected to each other to the connecting position 1309 where the shielding conductor 1306 and the metal casing 1304 are conductively connected together by the conductive connection member 1308 is higher by a greater amount than the characteristic impedance of the shielding conductor 1306 relative to the metal casing 1304 at an area from the connecting position 1309 to the connector 1311, radiated electromagnetic waves can be suppressed with higher reliability.

Therefore, by increasing the distance between the shielding conductor 1306 and the metal casing 1304 at the area from the position where the shielding conductor 1306 and the connector 1307 are connected to each other to the connecting position 1309 where the shielding conductor 1306 and the metal casing 1304 are conductively connected together by the conductive connection member 1308 to thereby increase the characteristic impedance Zc of the shielding conductor 1306 relative to the metal casing 1304, the input impedance |Zin| of the shielding conductor 1306 relative to the metal casing 1304 at the connector 1307 can be increased.

In the case of the example of the cable connection structure shown in FIG. 27, the height of the shielded cable 1303 relative to the metal casing 1304 is 1 cm, and as shown in the transmission line model of FIG. 28, the characteristic impedance Zc of the outer skin of the shielding conductor 1306 relative to the metal casing 1304 is 190 Ω. If the height of the shielded cable 1303 relative to the metal casing 1304 with the length L to the connecting position 1309 being 13.12 cm is increased to 3 cm by providing a depression 1310 in the metal casing 1304, the characteristic impedance Zc of the outer skin of the shielding conductor 1306 relative to the metal casing 1304 becomes 260 Ω.

Figure 32:
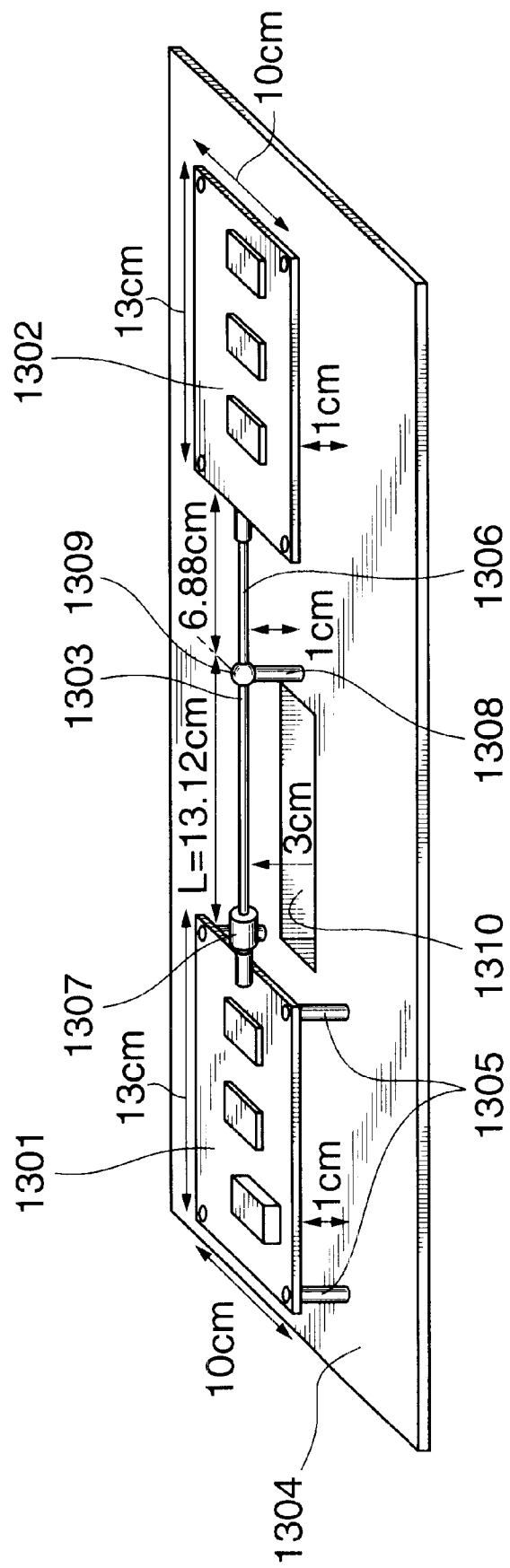
FIG. 32 is a perspective view showing a cable connection structure of an electronic apparatus, which is useful in explaining the operation of the present invention.
Figure 33:
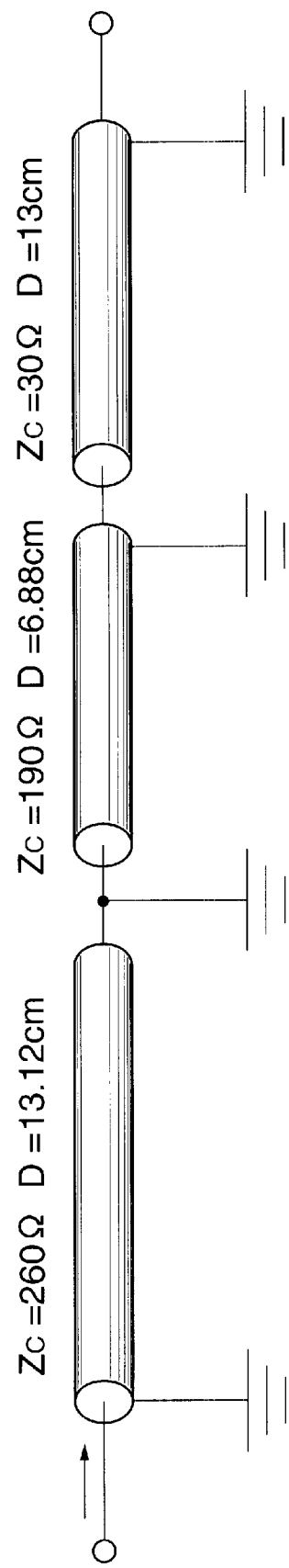
FIG. 33 is a schematic view showing a transmission line model, which is useful in explaining the operation of the present invention.
Figure 34:
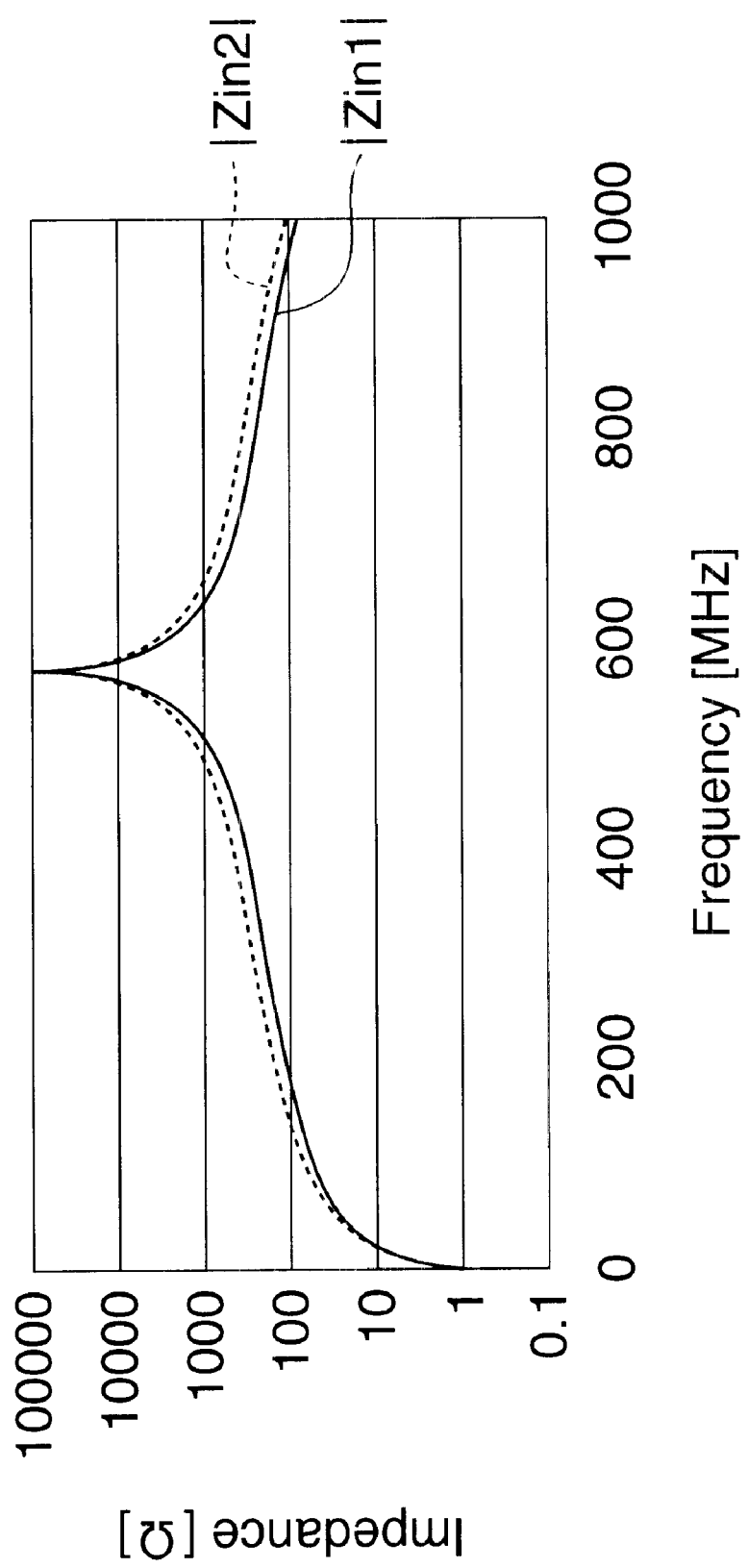
FIG. 34 is a graph showing an impedance characteristic, which is useful in explaining the operation of the present invention.
Figure 35:
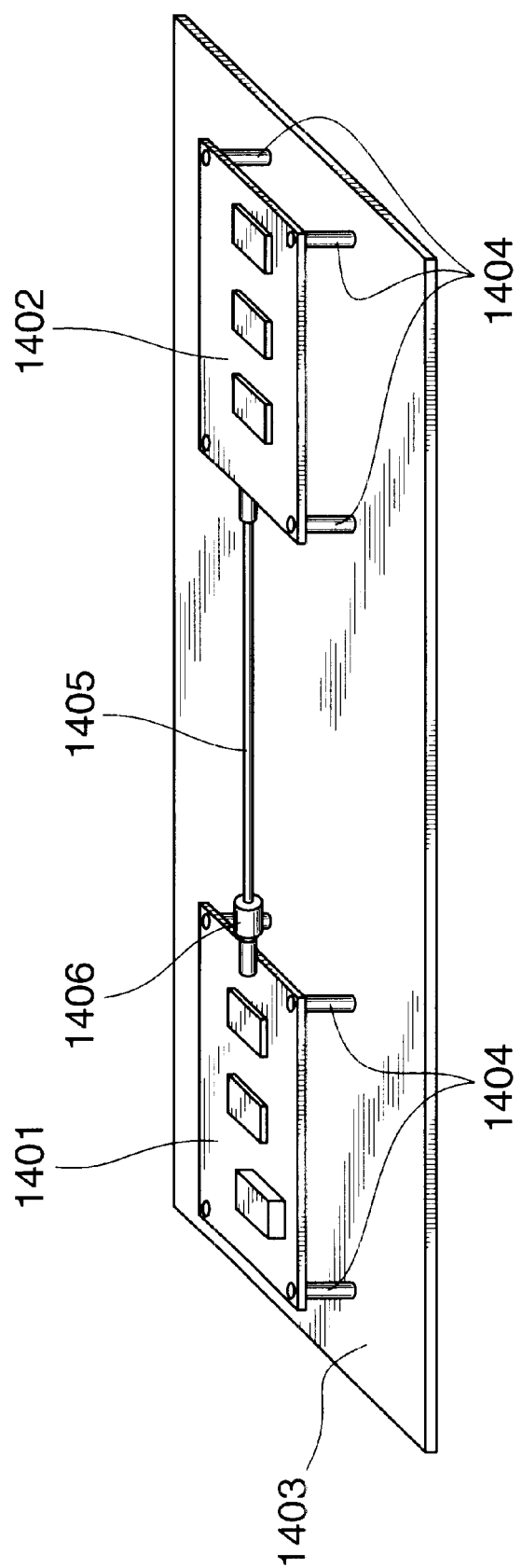
FIG. 35 is a perspective view showing a cable connection structure of an electronic apparatus according to the prior art.

An example of cable connection structure is shown in FIG. 32, a transmission line model thereof is shown in FIG. 33, and the input impedance characteristic thereof is shown in FIG. 34. In FIG. 34, |Zin 1| represents the input impedance in the example of cable connection structure shown in FIGS. 27 and 28, and |Zin 2| represents the input impedance in the example of cable connection structure shown in FIGS. 32 and 33. At the frequency of 200 MHz, |Zin 1|=117 Ω, and |Zin 2|=160 Ω.

Thus, compared to the example shown in FIGS. 27 and 28, by increasing the distance between the shielded cable 1303 and the metal casing 1304 at the area from the position where the shielding conductor 1306 and the connector 1307 are connected to each other to the connecting position 1309 where the shielding conductor 1306 and the metal casing 1304 are conductively connected together by the conductive connection member 1308, the characteristic impedance Zc can be increased, and also the input impedance characteristic can be increased.

Further, by mounting a ferrite core on the shielded cable 1303 while the shielding conductor 1306 is connected to the metal casing 1304 by the conductive connection member 1308, the input impedance |Zin| of the shielding conductor 1306 of the shielded cable 1303 relative to the metal casing 1304 at the connector 1307 can be increased in the frequency range of 300 MHz and below where radiated electromagnetic waves are of greater concern and are strictly regulated, and hence radiated electromagnetic waves in the above-mentioned frequency range can be more reliably suppressed.

Also, a resistance member such as a resistor and a ferrite core may be inserted into the conductive connection member 1308 that conductively connects the shielding conductor 1306 to the metal casing 1304 in the electronic apparatus to thereby absorb high frequency current flowing in the shielding conductor 1306 as a heat loss.

In this way, the input impedance of the shielding conductor 1306 of the shielded cable 1303 relative to the metal casing 1304 at the connector 1307 can assume no minimal value due to resonance in the frequency range where radiated electromagnetic waves from the shielded cable 1303 can cause a problem or in the regulated frequency range of radiated electromagnetic waves. Further, by increasing the input impedance over the entire frequency range mentioned above, a return current flowing in the inner skin of the shielding conductor 1306 of the shielded cable 1303 or a common mode current in the driver board 1301 does not flow into the outer skin of the shielding conductor 1306 of the shielded cable 1303, whereby radiated electromagnetic waves from the the outer skin of the shielding conductor 1306 and the receiver board 1302 can be suppressed.

First to twelfth embodiments of the present invention will be described in detail below with reference to the drawings.

[First Embodiment]

Figure 1:
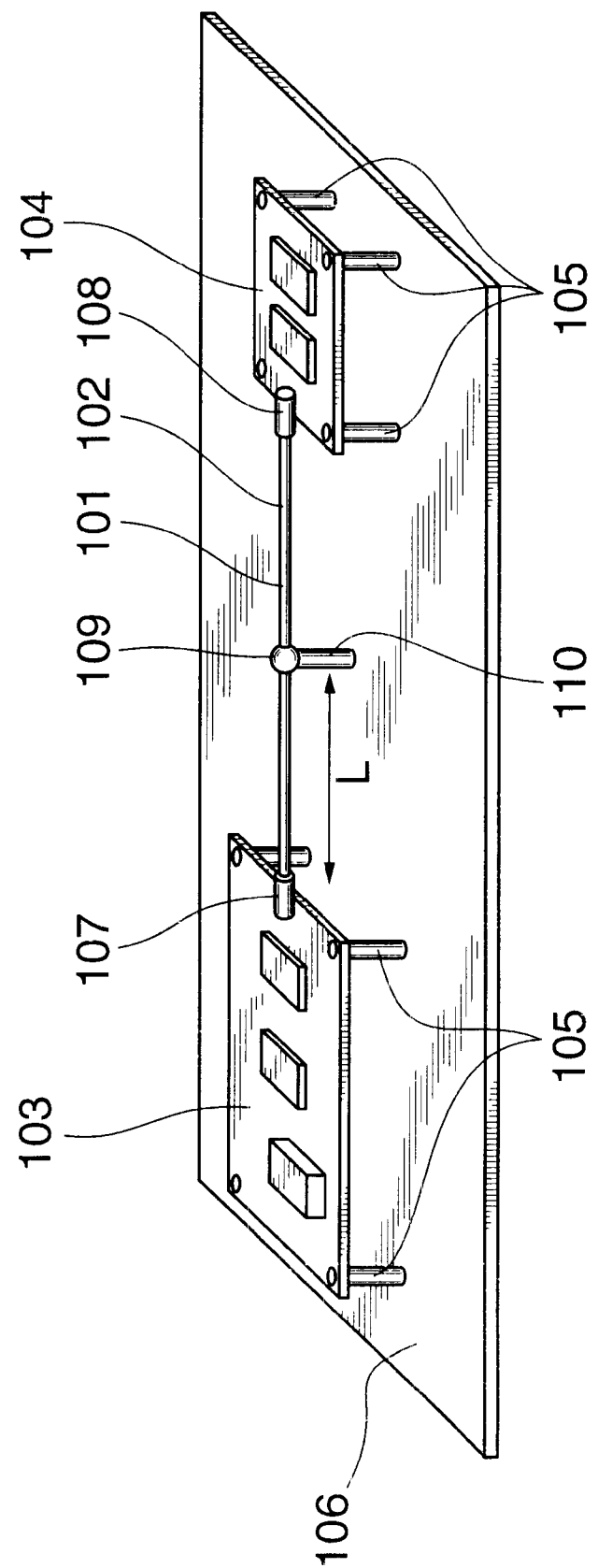
FIG. 1 is a perspective view showing a cable connection structure of an electronic apparatus according to a first embodiment of the present invention.

FIG. 1 is a perspective view showing a cable connection structure of an electronic apparatus according to a first embodiment of the present invention. As shown in FIG. 1, a shielded cable 101 according to the first embodiment is comprised of a signal line, and a shielding conductor 102 disposed around the signal line so as to cover the same. The shielding conductor 102 serves as ground and a shield. The shielded cable 101 connects two circuit boards 103, 104 to each other, and transmits signals between these circuit boards 103, 104.

The circuit board 103 on the signal transmitting side will be hereinafter referred to as the driver board, and the circuit board 104 on the signal receiving side will be hereinafter referred to as the receiver board. The shielded cable 101 and the driver board 103 are connected to each other by a connector 107, and the shielded cable 101 and the receiver board 104 are connected to each other by a connector 108. The ground for the driver board 103 and the receiver board 104 is conductively connected to a metal casing 106 of the electronic apparatus via metal spacers 105.

The shielding conductor 102 of the shielded cable 101 is conductively connected to the metal casing 106 by a conductive connection member 110. The length L1 from the position where the shielding conductor 102 is connected to the connector 107 to the connecting position 109 where the shielding conductor 102 and the metal casing 106 are conductively connected to each other by the conductive connection member 110 is set to a value obtained by multiplying $\frac{1}{32}$ to $\frac{7}{16}$ of the wavelength at the upper limit frequency of the relevant radiated electromagnetic waves emitted from the shielded cable 101 or $\frac{1}{32}$ to $\frac{7}{16}$ of the wavelength at the regulated upper limit frequency of the radiated electromagnetic waves by the wavelength reduction ratio at the shielding conductor 102 of the shielded cable 101.

Thus, by employing the cable connection structure according to the first embodiment of the present invention, in transmitting signals from the driver board 103 to the receiver board 104 in the electronic apparatus, radiated electromagnetic waves from the shielded cable 101 or the circuit boards 103, 104 due to resonance can be effectively suppressed in an inexpensive and simple manner.

[Second Embodiment]

Figure 2:
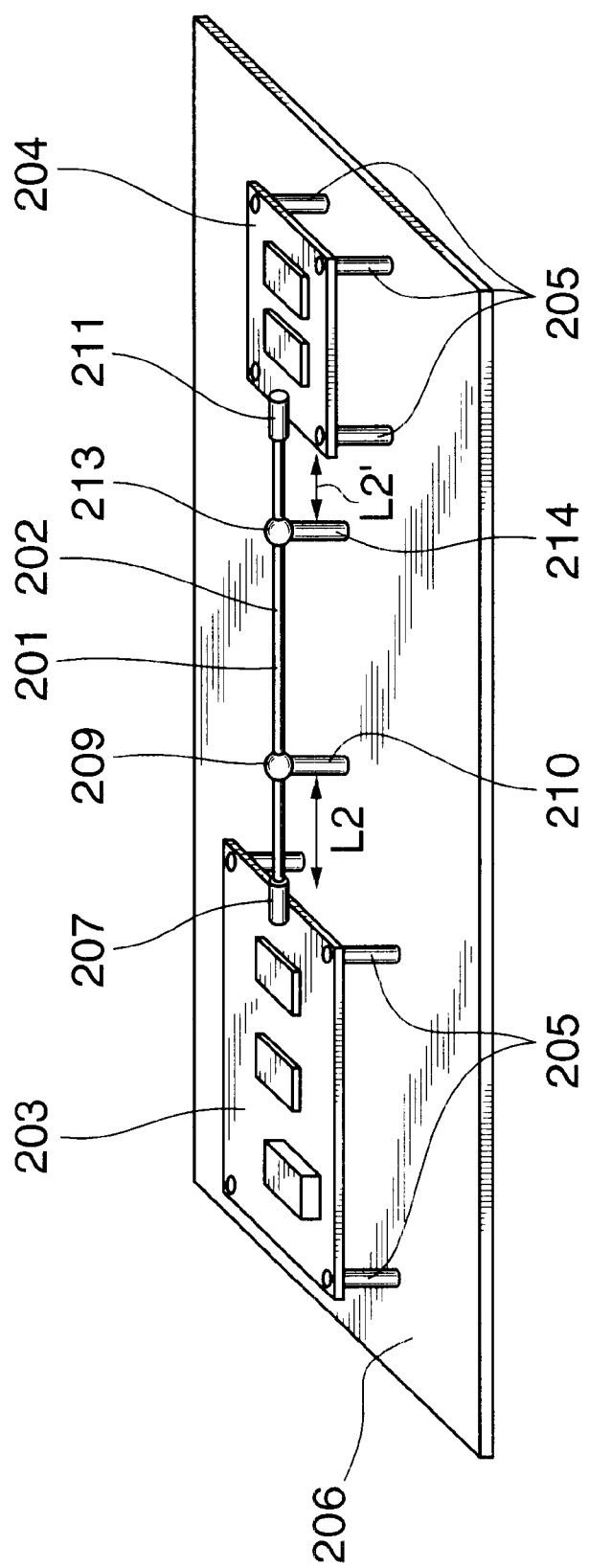
FIG. 2 is a perspective view showing a cable connection structure of an electronic apparatus according to a second embodiment of the present invention.

FIG. 2 is a perspective view showing a cable connection structure of an electronic apparatus according to a second embodiment of the present invention. As shown in FIG. 2, a shielded cable 201 according to the second embodiment is comprised of a signal line, and a sheathing conductor 202 disposed around the signal line so as to cover the same. The shielding conductor 202 serves as ground and a shield. The shielded cable 201 is connected to two circuit boards 203, 204 via connectors 207, 211, and transmits signals between these circuit boards 203, 204.

Each of the circuit boards 203, 204 has both functions of transmitting and receiving signals, and hence there is no distinction such as a driver board or a receiver board. Ground of the circuit boards 203, 204 is conductively connected via metal spacers 205 to a metal casing 206 of the electronic apparatus.

The shielding conductor 202 of the shielded cable 201 is conductively connected to the metal casing 206 by a conductive connection member 210. The length L2 from the position where the shielding conductor 202 is connected together to the connector 207 to the connecting position 209 where the shielding conductor 202 and the metal casing 206 are conductively connected together by the conductive connection member 210 is set to a value obtained by multiplying $\frac{1}{32}$ to $\frac{7}{16}$ of the wavelength at the upper limit frequency of the relevant radiated electromagnetic waves emitted from the shielded cable 201 or $\frac{1}{32}$ to $\frac{7}{16}$ of the wavelength at the regulated upper limit of the radiated electromagnetic waves by the wavelength reduction ratio at the shielding conductor 202 of the shielded cable 201.

Further, the shielding conductor 202 of the shielded cable 201 is conductively connected to the metal casing 206 by a conductive connection member 214. The length L2' from the position where the shielding conductor 202 is connected to the connector 211 to the connecting position 213 where the shielding conductor 202 and the metal casing 206 are conductively connected together by the conductive connection member 214 is set to a value obtained by multiplying $\frac{1}{32}$ to $\frac{7}{16}$ of the wavelength at the upper limit frequency of the relevant radiated electromagnetic waves emitted from the shielded cable 201, or $\frac{1}{32}$ to $\frac{7}{16}$ of the wavelength at the regulated upper limit frequency of the radiated electromagnetic waves by the wavelength reduction ratio at the shielding conductor 202 of the shielded cable 201.

If the length of the shielded cable 201 is less than L2+L2', it is not always necessary for two conductive connection members 210, 214 to be provided. A single conductive connection member may be used as both of the members 210, 214 insofar as the above-mentioned condition is satisfied.

Thus, by employing the cable connection structure according to the second embodiment of the present invention, in transmitting and receiving signals via the shielded cable 201 between the two circuit boards in an electronic apparatus, the radiated electromagnetic waves from the shielded cable 201 or the circuit boards 203, 204 due to resonance can be effectively suppressed in an inexpensive and simple manner.

[Third Embodiment]

Figure 3:
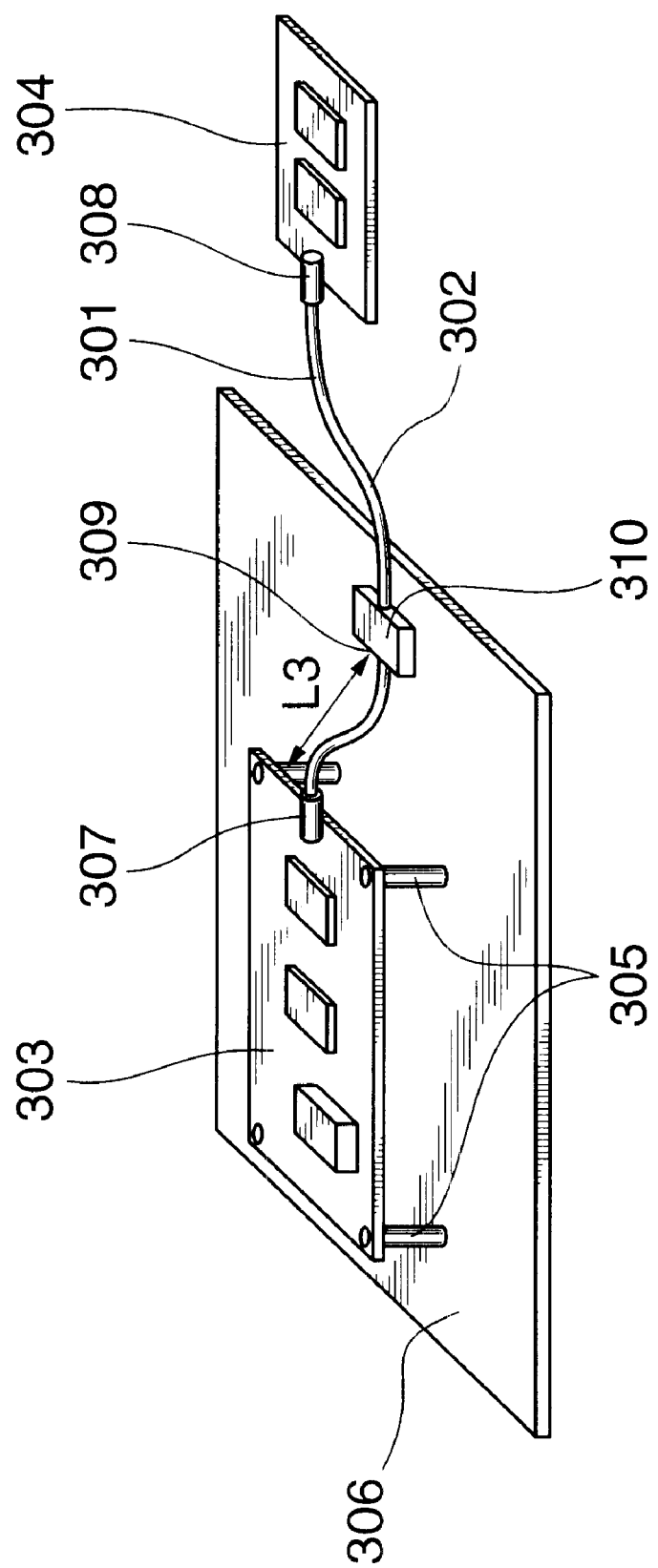
FIG. 3 is a perspective view showing a cable connection structure of an electronic apparatus according to a third embodiment of the present invention.

FIG. 3 is a perspective view showing a cable connection structure of an electronic apparatus according to a third embodiment of the present invention. As shown in FIG. 3, a shielded cable 301 according to the third embodiment is comprised of a signal line, and a shielding conductor 302 disposed around the signal line so as to cover the same. The shielding conductor 302 serves as ground and a shield. The shielded cable 301 connects two circuit boards 303, 304 to each other, and transmits signals between these circuit boards 303, 304.

The circuit board 303 on the signal transmitting side will be referred to as the driver board, and the circuit board 304 on the signal receiving side will be referred to as the receiver board. The shielded cable 301 and the driver board 303 are connected to each other by a connector 307, and the shielded cable 301 and the receiver board 304 are connected to each other by a connector 308. The ground of the driver board 303 is conductively connected to a metal casing 306 of the electronic apparatus via metal spacers 305. There is no metal casing below the receiver board 304, and the ground of the receiver board 304 is not conductively connected to the metal casing 306 of the electronic apparatus.

Even if there is no metal casing below the shielded cable 301 or below the receiver board 304 and the shielding conductor 302 of the shielded cable 301 or the receiver board 304 cannot be represented by a transmission line model relative to the metal casing, there still occurs the above described phenomenon that the input impedance of the shielding conductor 302 of the shielded cable 301 at the connector 307 exhibits a resonance characteristic, and radiated electromagnetic waves are generated when the input impedance is low.

For this reason, the shielding conductor 302 of the shielded cable 301 is conductively connected to the metal casing 306 by a conductive connection member 310. The length L3 from the position where the shielding conductor 302 is connected to the connector 307 to the connecting position 309 where the shielding conductor 302 and the metal casing 306 are conductively connected together by the conductive connection member 310 is set to a value obtained by multiplying 1/32 to 7/16 of the wavelength at the upper limit frequency of the relevant radiated electromagnetic waves emitted by the shielded cable 301 or 1/32 to 7/16 of the wavelength at the regulated upper limit frequency of the radiated electromagnetic waves by the wavelength reduction ratio at the shielding conductor 302 of the shielded cable 301.

Thus, by employing the cable connection structure according to the third embodiment of the present invention, even when there is no metal casing below the shielded cable 301 or below the receiver board 304, the present invention provides the effect that the input impedance of the shielding conductor 302 relative to the metal casing 306 at the connector 307 does not exhibit a low value due to resonance, and the radiated electromagnetic waves from the shielded cable 301 or the circuit boards 303, 304 can be effectively suppressed in an inexpensive and simple manner.

[Fourth Embodiment]

Figure 4:
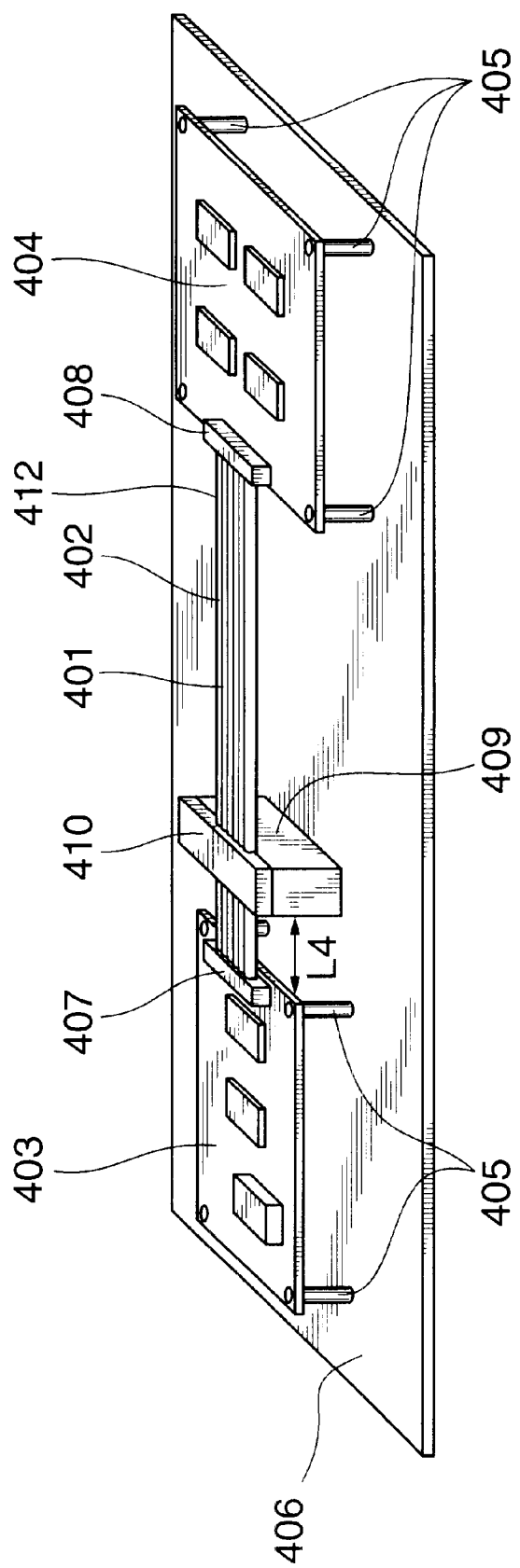
FIG. 4 is a perspective view showing a cable connection structure of an electronic apparatus according to a fourth embodiment of the present invention.

FIG. 4 is a perspective view showing a cable connection structure of an electronic apparatus according to a fourth embodiment of the present invention. As shown in FIG. 4, a shielded cable 401 is a multiconductor cable, and is comprised of a plurality of signal lines, a plurality of shielding conductors 402 disposed around the respective signal lines, and a plurality of dielectric materials 412 covering the respective shielding conductors 402. The shielding conductors 402 serve as ground and a shield. The multiconductor shielded cable 401 connects two circuit boards 403, 404 to each other, and transmits signals between these circuit boards 403, 404.

The circuit board 403 on the signal transmitting side will be referred to as the driver board, and the circuit board 404 on the signal receiving side will be referred to as the receiver board. The multiconductor shielded cable 401 and the driver board 403 are connected to each other by a connector 407, and the shielded cable 401 and the receiver board 404 are connected to each other by a connector 408. The ground of the driver board 403 and the receiver board 404 is conductively connected to a metal casing 406 of the electronic apparatus via metal spacers 405.

The shielding conductor 402 of the multiconductor shielded cable 401 is conductively connected to the metal casing 406 by a conductive connection member 410. The length L4 from the position where the shielding conductor 402 is connected to the connector 407 to the connecting position 409 where the shielding conductor 402 and the metal casing 406 are conductively connected together by the conductive connection member 410 is set to a value obtained by multiplying 1/32 to 7/16 of the wavelength at the upper limit frequency of the relevant radiated electromagnetic waves emitted by the multiconductor shielded cable 401 or 1/32 to 7/16 of the wavelength at the regulated upper limit frequency of the radiated electromagnetic waves by the wavelength reduction ratio at the shielding conductor 402 of the multiconductor shielded cable 401.

Thus, by employing the cable connection structure according to the fourth embodiment of the present invention, in transmitting a signal from the driver board 403 to the receiver board 404 in the electronic apparatus via the multiconductor shielded cable 401, the present invention provides the effect that the radiated electromagnetic waves from the multiconductor shielded cable 401 or the circuit boards 403, 404 due to resonance can be effectively suppressed in an inexpensive and simple manner.

[Fifth Embodiment]

Figure 5:
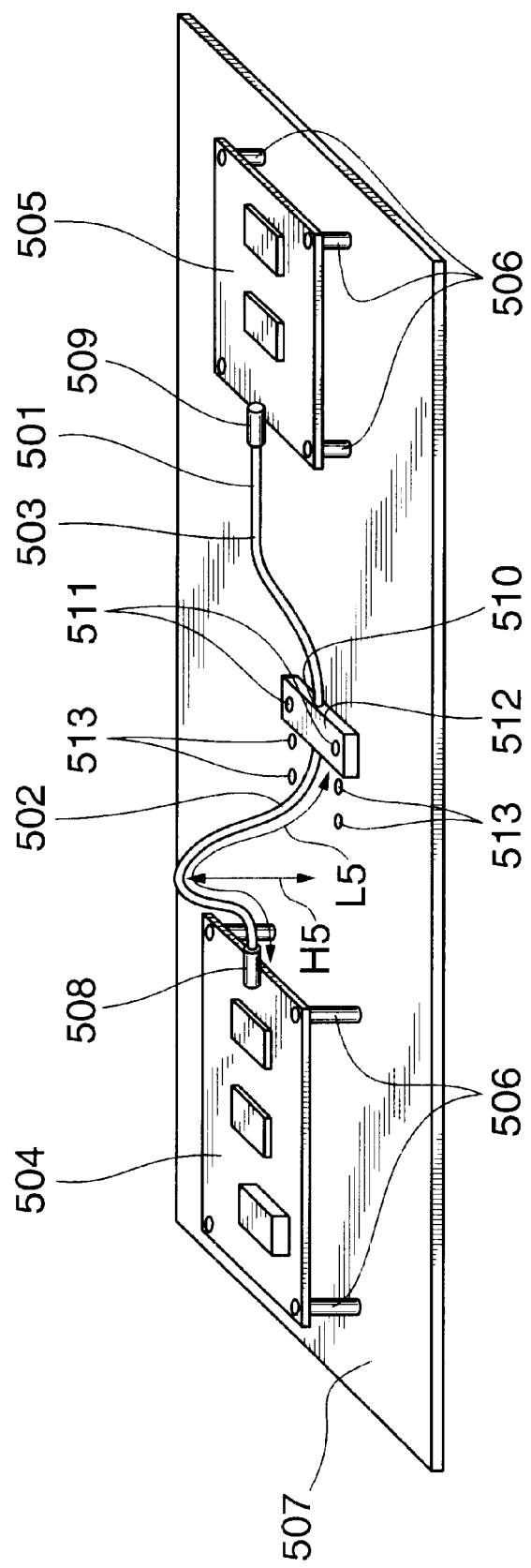
FIG. 5 is a perspective view showing a cable connection structure of an electronic apparatus according to a fifth embodiment of the present invention.
Figure 6:
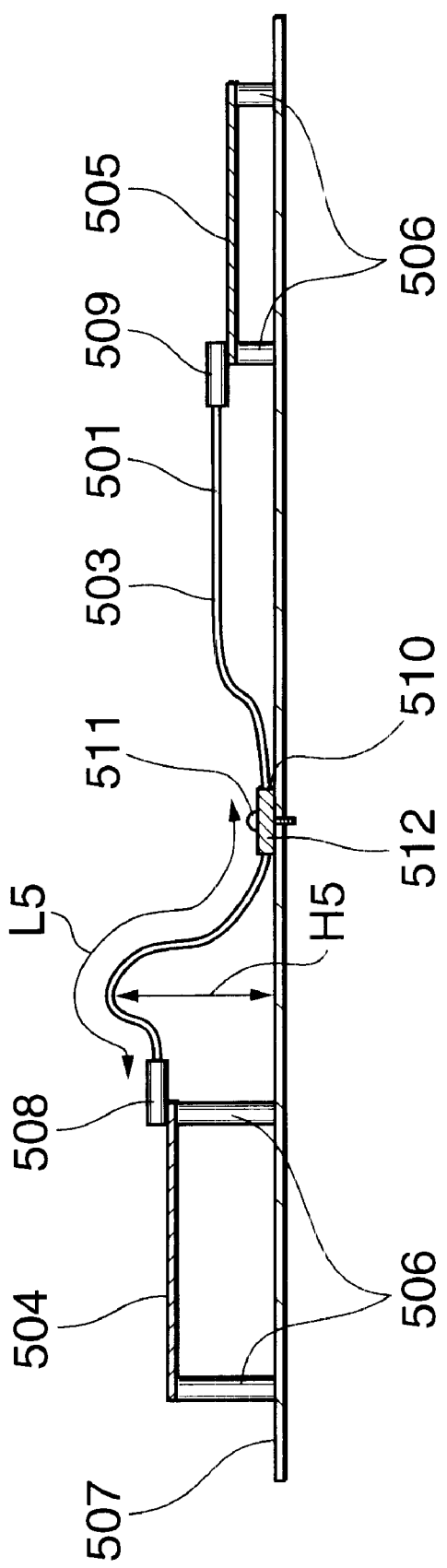
FIG. 6 is a side view showing the example of cable connection in the electronic apparatus according to the fifth embodiment.

FIG. 5 is a perspective view showing a cable connection structure of an electronic apparatus according to a fifth embodiment of the present invention, and FIG. 6 is a sectional side view of the same. As shown in FIGS. 5 and 6, a shielded cable 501 according to the fifth embodiment is comprised of a signal line, a shielding conductor 502 disposed around the signal line, and a dielectric material 503 covering the shielding conductor 502. The shielding conductor 502 serves as ground and a shield. The shielded cable 501 connects two circuit boards 504, 505 to each other, and transmits signals between these circuit boards 504, 505.

The circuit board 504 on the signal transmitting side will be referred to as the driver board, and the circuit board 505 on the signal receiving side will be referred to as the receiver board. The shielded cable 501 and the driver board 504 are connected to each other by a connector 508, and the shielded cable 501 and the receiver board 505 are connected to each other by a connector 509. The ground of the driver board 504 and the receiver board 505 is conductively connected to a metal casing 507 of the electronic apparatus via metal spacers 506.

The shielding conductor 502 of the shielded cable 501 is conductively connected together by a conductive connection member 512 to the metal casing 507. The shielding conductor 502 is conductively connected to the conductive connection member 512 by removing a portion of the dielectric material 503 covering the shielding conductor 502. The conductive connection member 512 is fixed to the metal casing 507 by conductive screws 511. A plurality of threaded holes 513 are formed in the metal casing 507 so as to enable adjustment of the length L5 from the position where the shielding conductor 502 is connected to the connector 508 to the connecting position 510 where the shielding conductor 502 and the metal casing 507 are conductively connected together by the conductive connection member 512. The range of length L5 which is thus adjustable is set to a value obtained by multiplying $\frac{1}{32}$ to $\frac{7}{16}$ of the wavelength at the upper limit frequency of the relevant radiated electromagnetic waves emitted by the shielded cable 501 or $\frac{1}{32}$ to $\frac{7}{16}$ of the wavelength at the regulated upper limit frequency of the radiated electromagnetic waves by the wavelength reduction ratio at the shielding conductor 502 of the shielded cable 501.

Further, by changing the threaded holes 513 for fixing the conductive connection member 512, the length L5 from the position where the shielding conductor 502 and the connector 508 connected together to the connecting position 510 where the shielding conductor 502 and the metal casing 507 are conductively connected together by the conductive connection member 512 may be adjusted, and in addition, the height H5 of a portion of the shielded cable 501 from the position where the shielding conductor 502 and the connector 508 connected together to the connecting position 510 relative to the metal casing 507 can also be adjusted. As stated before, by increasing the height H5, the characteristic impedance of the shielding conductor 502 relative to the metal casing 507 can be increased, whereby radiated electromagnetic waves can be suppressed.

Thus, by employing the cable connection structure in which the position of the conductive connection member can be adjusted, according to the fifth embodiment of the present invention, in transmitting a signal from the driver board 504 to the receiver board 505 in the electronic apparatus, the present invention provides the effect that radiated electromagnetic waves from the shielded cable 501 or the circuit boards 504, 505 due to resonance can be effectively suppressed in an inexpensive and simple manner.

[Sixth Embodiment]

Figure 7:
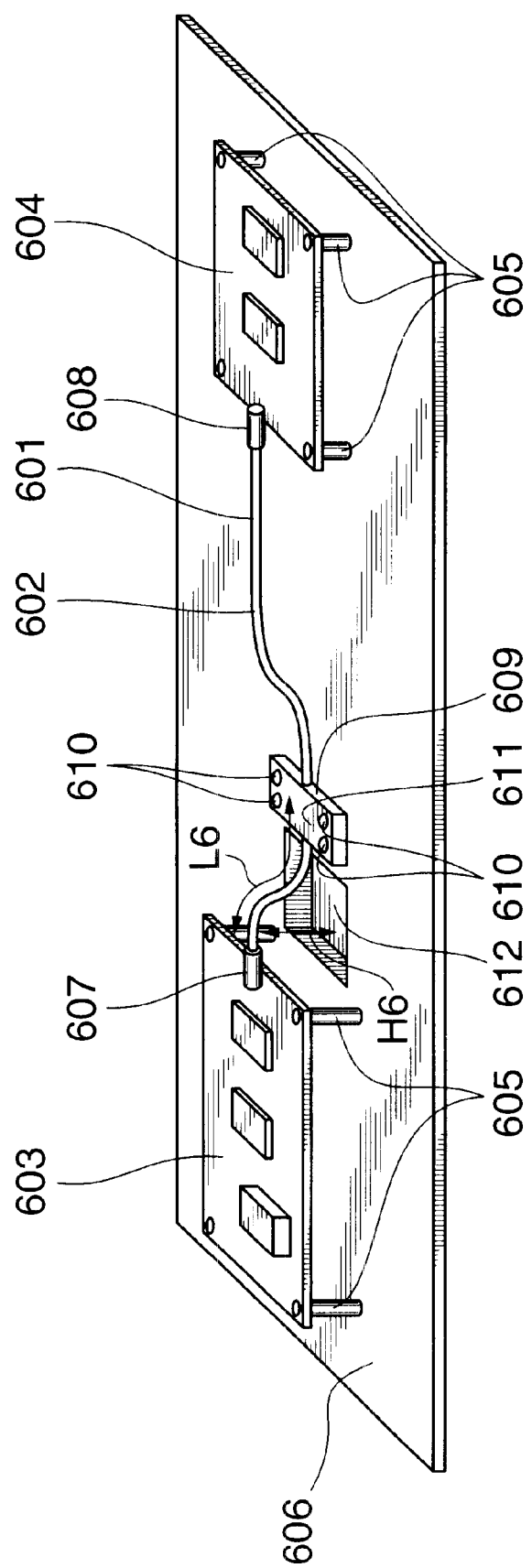
FIG. 7 is a perspective view showing a cable connection structure of an electronic apparatus according to a sixth embodiment of the present invention.
Figure 8:
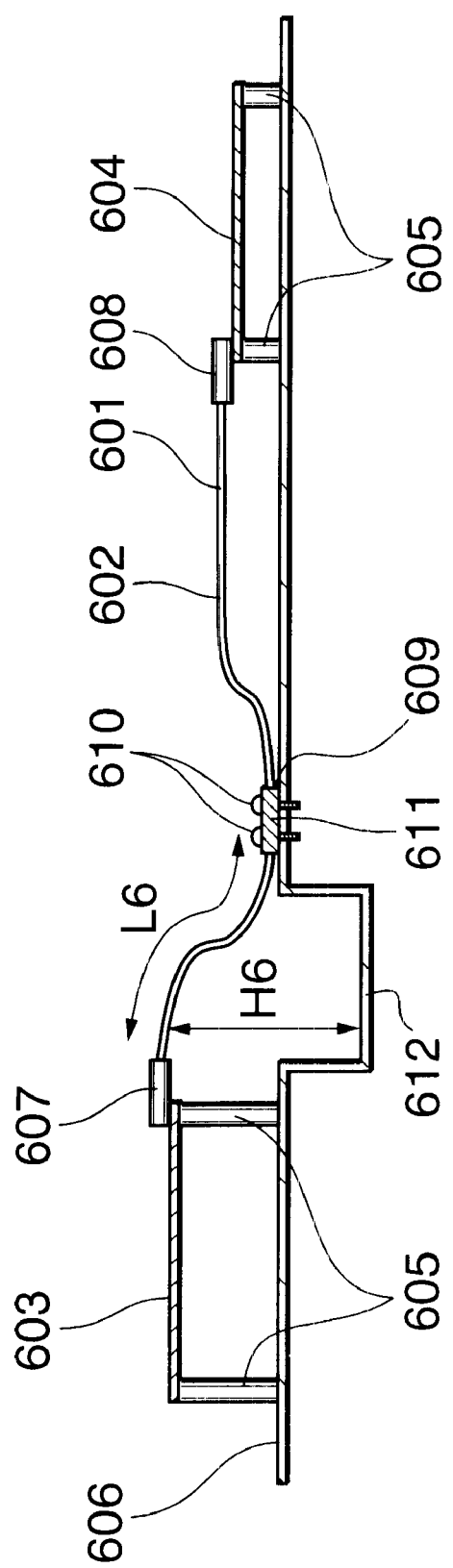
FIG. 8 is a side view showing the example of cable connection in the electronic apparatus according to the sixth embodiment.

FIG. 7 is a perspective view showing a cable connection structure of an electronic apparatus according to a sixth embodiment of the present invention, and FIG. 8 is a sectional side view of the same. As shown in FIGS. 7 and 8, a shielded cable 601 according to the sixth embodiment is comprised of a signal line, and a shielding conductor 602 disposed around the signal line. The shielding conductor 602 serves as ground and a shield. The shielded cable 601 connects two circuit boards 603, 604 to each other, and transmits signals between these circuit boards 603, 604.

The circuit board 603 on the signal transmitting side will be referred to as the driver board, and the circuit board 604 on the signal receiving side will be referred to as the receiver board. The shielded cable 601 and the driver board 603 are connected to each other by a connector 607, and the shielded cable 601 and the receiver board 604 are connected to each other by a connector 608. The ground of the driver board 603 and the receiver board 604 is conductively connected to a metal casing 606 of the electronic apparatus via metal spacers 605.

The shielding conductor 602 of the shielded cable 601 is conductively connected together by a conductive connection member 611 to the metal casing 606. The length L6 from the position where the shielding conductor 602 is connected to the connector 607 to the connecting position 609 where the shielding conductor 602 and the metal casing 606 are connected together by a conductive connection member 611 is set to a value obtained by multiplying $\frac{1}{32}$ to $\frac{7}{16}$ of the wavelength at the upper limit frequency of the relevant radiated electromagnetic waves emitted by the shielded cable 601 or $\frac{1}{32}$ to $\frac{7}{16}$ of the wavelength at the regulated upper limit frequency of the radiated electromagnetic waves by the wavelength reduction ratio at the shielding conductor 602 of the shielded cable 601.

A depression 612 is formed in the metal casing 606 at a location between the position where the shielding conductor 602 is connected to the connector 607 to the connecting position 609 where the shielding conductor 602 and the metal casing 606 are connected together by the conductive connection member 611. By providing the depression 612, the distance H6 between a portion of the shielding conductor 602 of the shielded cable 601 directly above the depression 612 and the metal casing 606 is set larger than the distance between the other portions of the shielding conductor 602 of the shielded cable 601 and the metal casing 606. Therefore, the characteristic impedance of the shielding conductor 602 relative to the metal casing 606 at the portion directly above or corresponding to the depression 612 is higher than the characteristic impedance of the shielding conductor 602 at the other portions, whereby radiated electromagnetic waves can be suppressed.

Thus, by employing the cable connection structure in which a depression is provided in the metal casing 606, according to the sixth embodiment of the present invention, in transmitting a signal from the driver board 603 to the receiver board 604 in the electronic apparatus, the present invention provides the effect that radiated electromagnetic waves from the shielded cable 601 or the circuit boards 603, 604 can be effectively suppressed in an inexpensive and simple manner.

[Seventh Embodiment]

Figure 9:
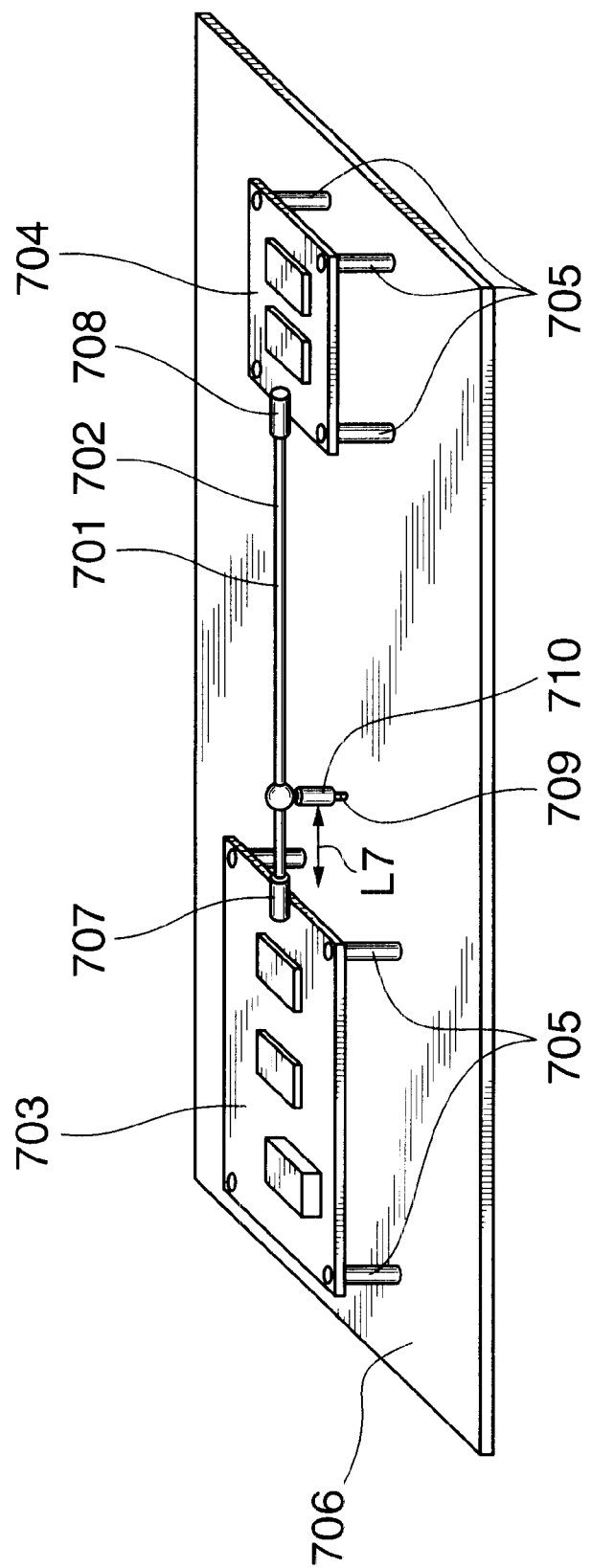
FIG. 9 is a perspective view showing a cable connection structure of an electronic apparatus according to a seventh embodiment of the present invention.

FIG. 9 is a perspective view showing a cable connection structure of an electronic apparatus according to a seventh embodiment of the present invention. As shown in FIG. 9, a coaxial cable 701 according to the seventh embodiment is comprised of a signal line, and a shielding conductor 702 disposed around the signal line so as to cover the same. The shielding conductor 702 serves as ground and a shield. The shielded cable 701 connects two circuit boards 703, 704 to each other, and transmits signals between these circuit boards 703, 704.

The circuit board 703 on the signal transmitting side will be referred to as the driver board, and the circuit board 704 on the signal receiving side will be referred to as the receiver board. The shielded cable 701 and the driver board 703 are connected to each other by a connector 707, and the shielded cable 701 and the receiver board 704 are connected to each other by a connector 708. The ground of the driver board 703 and the receiver board 704 is conductively connected to a metal casing 706 of the electronic apparatus via metal spacers 705.

The shielding conductor 702 of the shielded cable 701 is conductively connected to the metal casing 706 by a conductive connection member 710. The conductive connection member 710 is formed of a resistance member. The length L7 from the position where the shielding conductor 702 is connected to the connector 707 to the connecting position 709 where the shielding conductor 702 and the connector 706 are conductively connected to each other by the conductive connection member 710 is set to a value obtained by multiplying 1/32 to 7/16 of the wavelength at the upper limit frequency of the relevant radiated electromagnetic waves emitted from the shielded cable 701 or 1/32 to 7/16 of the wavelength at the regulated upper limit frequency of the radiated electromagnetic waves by the wavelength reduction ratio at the shielding conductor 702 of the shielded cable 701.

The conductive connection of the shielding conductor 702 of the shielded cable 701 and the metal casing 706 using the resistance member 710 causes high frequency current flowing in the shielding conductor 702 of the shielded cable 701 to be dissipated as heat loss, whereby the input impedance of the shielding conductor 702 of the shielded cable 701 relative to the metal casing 706 at the connector 707 can be prevented from becoming low due to resonance characteristics, and hence radiated electromagnetic waves from the shielded cable 701 can be suppressed.

Thus, according to the seventh embodiment of the present invention, by employing the cable connection structure using a resistance member as the conductive connection member 710, in transmitting a signal from the driver board 703 to the receiver board 704 in the electronic apparatus, the present invention provides the effect that radiated electromagnetic waves from the shielded cable 701 or the circuit boards 703, 704 due to resonance can be effectively suppressed in an inexpensive and simple manner.

[Eighth Embodiment]

Figure 10:
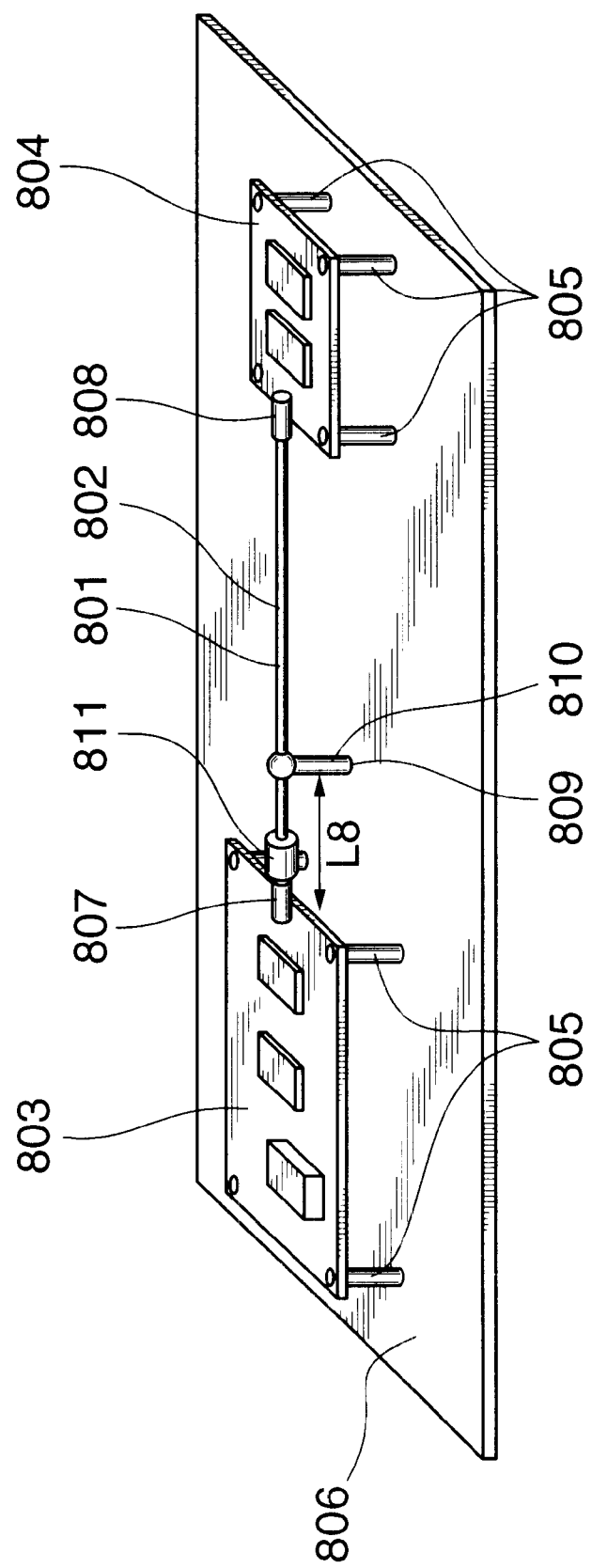
FIG. 10 is a perspective view showing a cable connection structure of an electronic apparatus according to an eighth embodiment of the present invention.

FIG. 10 is a perspective view showing a cable connection structure of an electronic apparatus according to an eighth embodiment of the present invention. As shown in FIG. 10, a shielded cable 801 according to the eighth embodiment is comprised of a signal line, and a shielding conductor 802 disposed around the signal line so as to cover the same. The shielding conductor 802 serves as ground and a shield. The shielded cable 801 connects two circuit boards 803, 804 to each other, and transmits signals between these circuit boards 803, 804.

The circuit board 803 on the signal transmitting side will be referred to as the driver board, and the circuit board 804 on the signal receiving side will be referred to as the receiver board. The shielded cable 801 and the driver board 803 are connected to each other by a connector 807, and the shielded cable 801 and the receiver board 804 are connected to each other by a connector 808. The ground of the driver board 803 and the receiver board 804 is conductively connected to a metal casing 806 of the electronic apparatus via metal spacers 805.

The shielding conductor 802 of the shielded cable 801 is conductively connected to the metal casing 806 by a conductive connection member 810. The length L8 from the position where the shielding conductor 802 is connected to the connector 807 to the connecting position 809 where the shielding conductor 802 and the metal casing 806 are conductively connected to each other by the conductive connection member 810 is set to a value obtained by multiplying 1/32 to 7/16 of the wavelength at the upper limit frequency of the relevant radiated electromagnetic waves emitted from the shielded cable 801 or 1/32 to 7/16 of the wavelength at the regulated upper limit frequency of the radiated electromagnetic waves by the wavelength reduction ratio at the shielding conductor 802 of the shielded cable 801.

The shielded cable 801 has a cylindrical ferrite core 811 mounted on a peripheral portion thereof. The use of the ferrite core 811 causes high frequency current flowing in the shielding conductor 802 to be dissipated as heat loss, whereby the input impedance of the shielding conductor 802 of the shielded cable 801 relative to the metal casing 806 at the connector 807 is prevented from becoming low due to resonance characteristics. The ferrite core 811 has the effect of suppressing radiated electromagnetic waves from the shielded cable 801 in the frequency range of 300 MHz and below.

The use of the conductive connection member 810 in conjunction with the ferrite core 811 provides sufficient counter measures to suppress radiated electromagnetic waves in the frequency range of 300 MHz and below in which the radiated electromagnetic waves can cause a problem and are strictly regulated. The means using the conductive connection member 810 may lead to a somewhat lower impedance in a low frequency region than in a high frequency region, and can be therefore less effective in suppressing the radiated electromagnetic waves. By using the ferrite core in conjunction with the conductive connection member 810, it is possible even in such a situation to suppress the radiated electromagnetic waves over the entire frequency range concerned.

Thus, according to the eighth embodiment of the present invention, by employing the cable connection structure in which the ferrite core 811 is mounted on the shielded cable 801, in transmitting a signal from the driver board 803 to the receiver board 804 in the electronic apparatus, the present invention provides the effect that radiated electromagnetic waves from the shielded cable 801 or the circuit boards 803, 804 due to resonance can be effectively suppressed in an inexpensive and simple manner.

[Ninth Embodiment]

Figure 11:
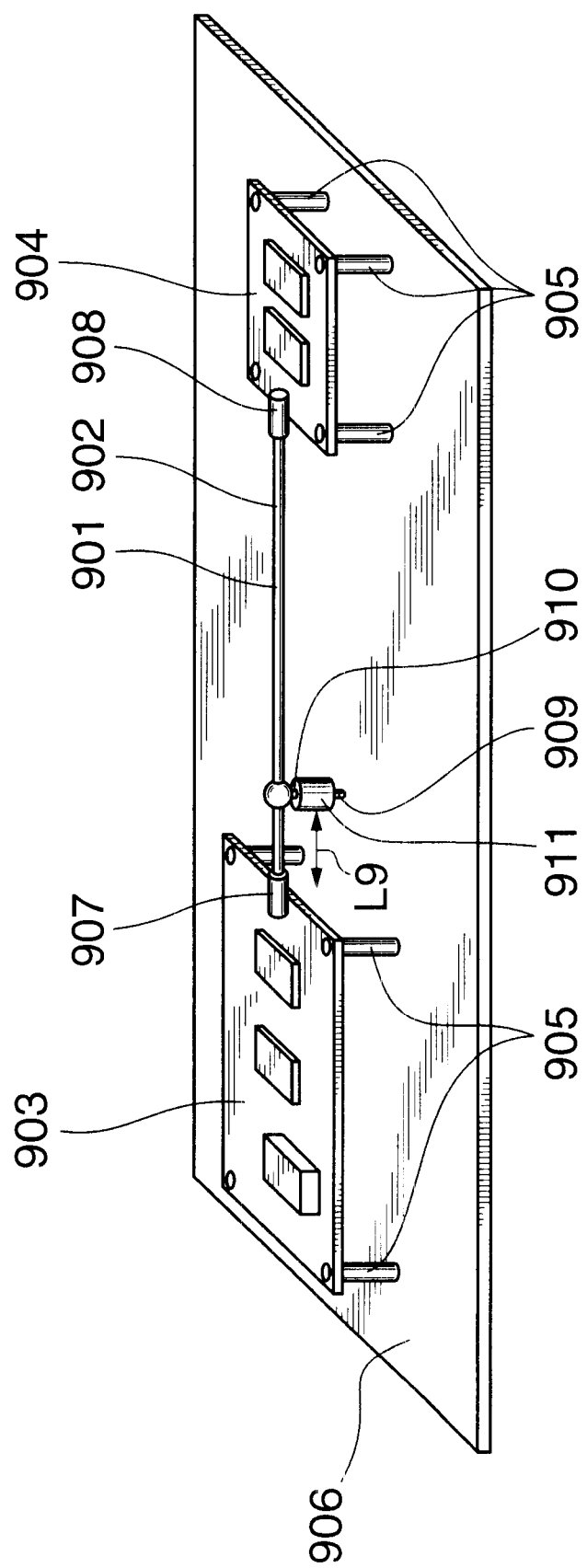
FIG. 11 is a perspective view showing a cable connection structure of an electronic apparatus according to a ninth embodiment of the present invention.

FIG. 11 is a perspective view showing a cable connection structure of an electronic apparatus according to a ninth embodiment of the present invention. As shown in FIG. 11, a shielded cable 901 according to the ninth embodiment is comprised of a signal line, and a shielding conductor 902 disposed around the signal line so as to cover the same. The shielding conductor 902 serves as ground and a shield. The shielded cable 901 connects two circuit boards 903, 904 to each other, and transmits signals between these circuit boards 903, 904.

The circuit board 903 on the signal transmitting side will be referred to as the driver board, and the circuit board 904 on the signal receiving side will be referred to as the receiver board. The shielded cable 901 and the driver board 903 are connected to each other by a connector 907, and the shielded cable 901 and the receiver board 904 are connected to each other by a connector 908. The ground of the driver board 903 and the receiver board 904 is conductively connected to a metal casing 906 of the electronic apparatus via metal spacers 905.

The shielding conductor 902 of the shielded cable 901 is conductively connected to the metal casing 906 by a conductive connection member 910. The conductive connection member 910 has a cylindrical ferrite core 911 mounted on a peripheral portion thereof. The length L9 from the position where the shielding conductor 902 is connected to the connector 907 to the connecting position 909 where the shielding conductor 902 and the metal casing 906 are conductively connected to each other by the conductive connection member 910 is set to a value obtained by multiplying 1/32 to 7/16 of the wavelength at the upper limit frequency of the relevant radiated electromagnetic waves emitted from the shielded cable 901 or 1/32 to 7/16 of the wavelength at the regulated upper limit frequency of the radiated electromagnetic waves by the wavelength reduction ratio at the shielding conductor 902 of the shielded cable 901.

The mounting of the ferrite core 911 on the peripheral portion of the conductive connection member 910 causes high frequency current flowing in the shielding conductor 902 of the shielded cable 901 to be dissipated as heat loss, whereby the input impedance of the shielding conductor 902 of the shielded cable 901 at the connector 907 is prevented from becoming low due to resonance characteristics, and hence the radiated electromagnetic waves from the shielded cable 901 can be suppressed.

Thus, according to the ninth embodiment of the present invention, by employing the cable connection structure in which the ferrite core 911 is mounted on the conductive connection member 910, in transmitting a signal from the driver board 903 to the receiver board 904 in the electronic apparatus, the present invention provides the effect that radiated electromagnetic waves from the shielded cable 901 or the circuit boards 903, 904 due to resonance can be effectively suppressed in an inexpensive and simple manner.

[Tenth Embodiment]

Figure 12:
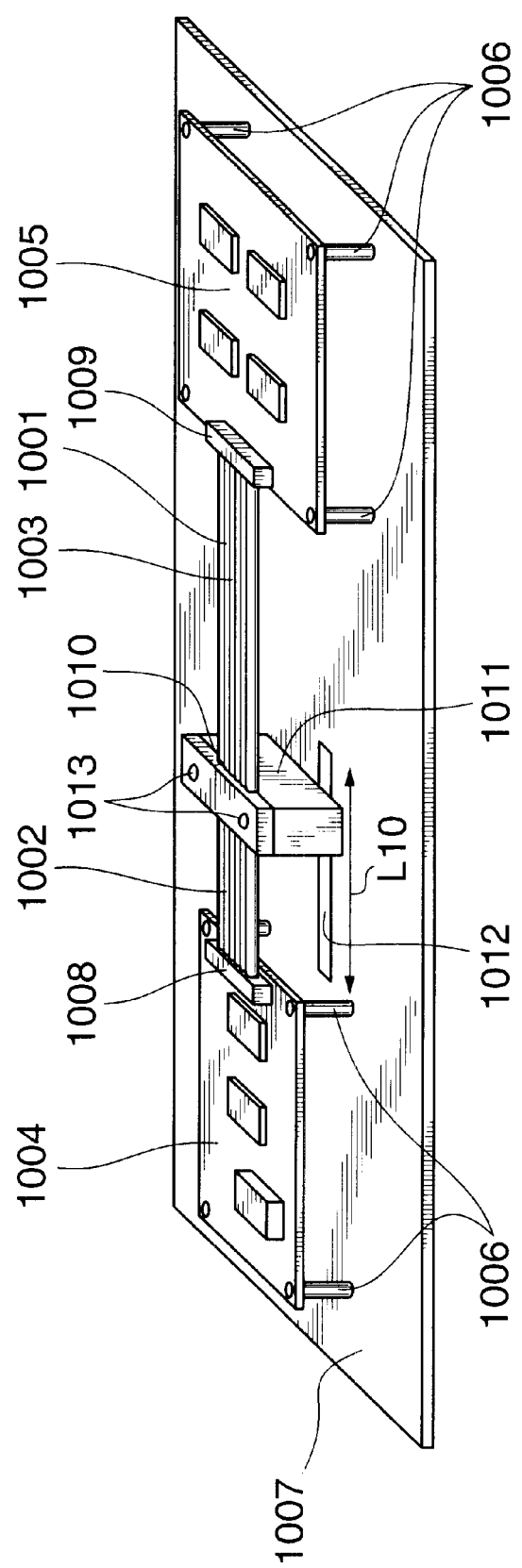
FIG. 12 is a perspective view showing a cable connection structure of an electronic apparatus according to a tenth embodiment of the present invention.

FIG. 12 is a perspective view showing a cable connection structure of an electronic apparatus according to a tenth embodiment of the present invention. As shown in FIG. 12, a multiconductor shielded cable 1001 according to the tenth embodiment is comprised of a plurality of signal lines, a plurality of shielding conductor 1002 disposed around the respective signal lines so as to cover the same, and a plurality of dielectric materials 1003 that cover the respective shielding conductors 1002. The shielding conductors 1002 serve as ground and a shield. The multiconductor shielded cable 1001 connects two circuit boards 1004, 1005 to each other, and transmits signals between these circuit boards 1004, 1005.

The circuit board 1004 on the signal transmitting side will be referred to as the driver board, and the circuit board 1005 on the signal receiving side will be referred to as the receiver board. The multiconductor shielded cable 1001 and the driver board 1004 are connected to each other by a connector 1008, and the shielded cable 1001 and the receiver board 1005 are connected to each other by a connector 1009. The ground of the driver board 1004 and the receiver board 1005 is conductively connected to a metal casing 1007 of the electronic apparatus via metal spacers 1006.

The shielding conductors 1002 of the shielded cable 1001 are conductively connected to the metal casing 1007 by a conductive connection member 1011. By removing portions of the dielectric material 1003 that cover the shielding conductors 1002, the shielding conductors 1002 are conductively connected to the conductive connection member 1011. The conductive connection member 1011 is adjustable in position with respect to the metal casing 1007 by means of a slit 1012, and it can be fixed at an arbitrary position along the slit 1012 via conductive screws 1013. The range of length L10 which is thus adjustable from the position where the shielding conductors 1002 are connected to the connector 1008 to the connecting position 1010 where the shielding conductors 1002 and the metal casing 1007 are conductively connected to each other by the conductive connection member 1011 is set to a value obtained by multiplying $1/32$ to $7/16$ of the wavelength at the upper limit frequency of the relevant radiated electromagnetic waves emitted by the shielded cable 1001 or $1/32$ to $7/16$ of the wavelength at the regulated upper limit frequency of the radiated electromagnetic waves by the wavelength reduction ratio at the shielding conductor 1002 of the shielded cable 1001.

Thus, according to the tenth embodiment of the present invention, by employing the cable connection structure in which the position of the conductive connection member 1011 can be adjusted by means of the slit 1012, in transmitting a signal from the driver board 1004 to the receiver board 1005 in the electronic apparatus, the present invention provides the effect that generation of radiated electromagnetic waves from the multiconductor shielded cable 1001 or the circuit boards 1004, 1005 due to resonance can be effectively suppressed in an inexpensive and simple manner.

[Eleventh Embodiment]

Figure 13:
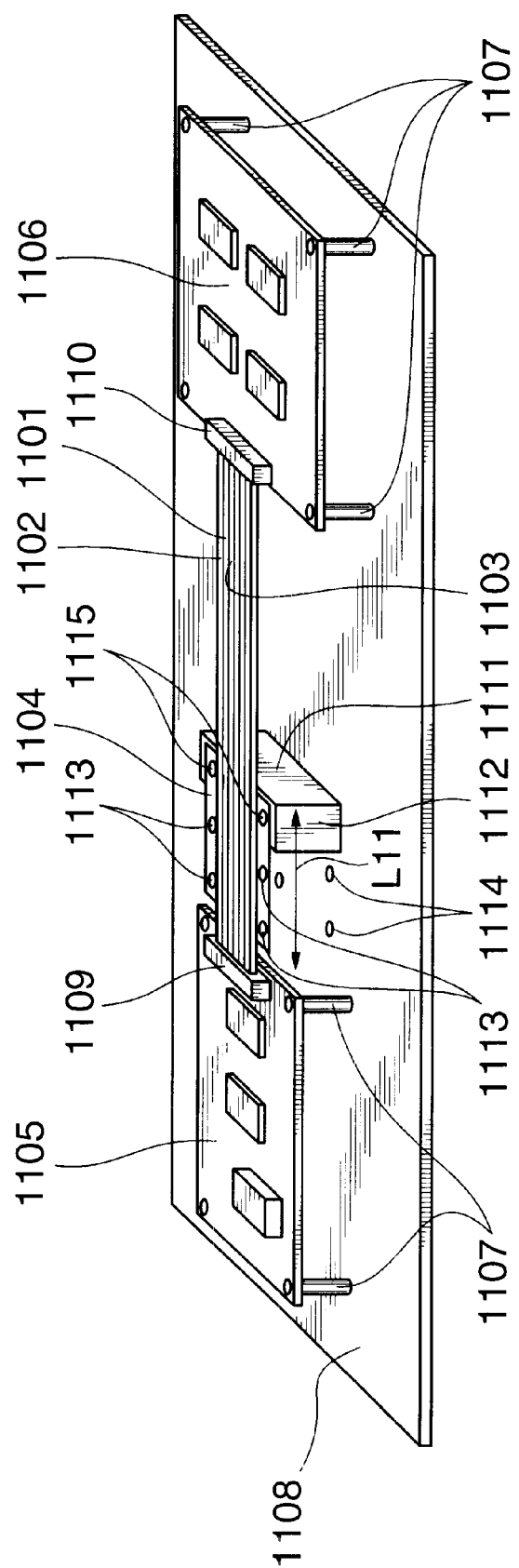
FIG. 13 is a perspective view showing a cable connection structure of an electronic apparatus according to an eleventh embodiment of the present invention.

FIG. 13 is a perspective view showing a cable connection structure of an electronic apparatus according to an eleventh embodiment of the present invention. As shown in FIG. 13, according to the eleventh embodiment a flexible sheet-shaped shielded cable 1101 is used, which is comprised of a signal line 1102, a dielectric material 1103, and a flexible shielding conductor 1104 formed in one body with the signal line 1102 and the dielectric material 1103. The shielding conductor 1104 serves as ground and a shield. The sheet-shaped shielded cable 1101 connects two circuit boards 1105, 1106 to each other, and transmits signals between these circuit boards 1105, 1106.

The circuit board 1105 on the signal transmitting side will be referred to as the driver board, and the circuit board 1106 on the signal receiving side will be referred to as the receiver board. The sheet-shaped shielded cable 1101 and the driver board 1105 are connected to each other by a connector 1109, and the sheet-shaped shielded cable 1101 and the receiver board 1106 are connected to each other by a connector 1110. The ground of the driver board 1105 and the receiver board 1106 is conductively connected to a metal casing 1108 of the electronic apparatus via metal spacers 1107.

The shielding conductor 1104 of the sheet-shaped shielded cable 1101 is conductively connected to the metal casing 1108 by a conductive connection member 1112. The conductive connection member 1112 is fixed to the shielding conductor 1104 and the metal casing 1108 by means of conductive screws 1115. The conductive connection member 1112 can be adjusted in position using threaded holes 1113 formed in the shielding conductor 1104 and threaded holes 1114 formed in the metal casing 1108. The range of length L11 which is thus adjustable from the position where the shielding conductor 1104 is connected to the connector 1109 to the connecting position 1111 where the shielding conductor 1104 and the metal casing 1108 are conductively connected to each other by the conductive connection member 1112 is set to a value obtained by multiplying $1/32$ to $7/16$ of the wavelength at the upper limit frequency of the relevant radiated electromagnetic waves emitted by the sheet-shaped shielded cable 1101 or $1/32$ to $7/16$ of the wavelength at the regulated upper limit frequency of the radiated electromagnetic waves by the wavelength reduction ratio at the shielding conductor 1104 of the shielded cable 1101.

The method of adjusting the position of the conductive connection member 1112 is not limited to the position adjustment by means of the threaded holes 1113 formed in the shielding conductor 1104 as described above. A plurality of slits may be formed in the shielding conductor 1104 and the position may be adjusted using the slits. The shape of the shielded cable is not limited to the shape of a sheet, and a shielded cable having a circular cross section may be employed.

FIGS. 14, 15, 16, and 17 are cross-sectional views showing several variations of the connection of the flexible sheet-shaped shielded cable 1101 according to the eleventh embodiment of the present invention to the metal casing 1108 by the conductive connection member 1112.

Figure 14:
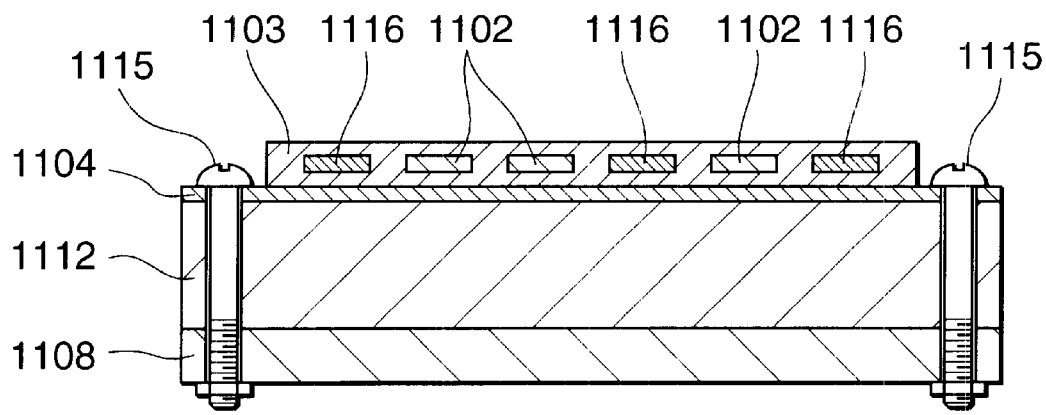
FIG. 14 is a sectional view showing the example of cable connection in the electronic apparatus according to the eleventh embodiment.
Figure 15:
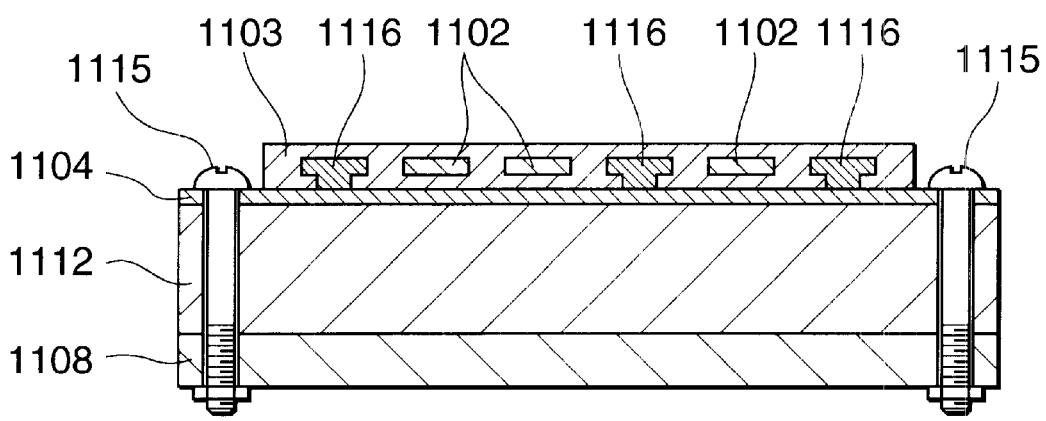
FIG. 15 is a sectional view showing the example of cable connection in an electronic apparatus according to the eleventh embodiment.

FIGS. 14 and 15 are views showing cases where the shielding conductor 1104 is provided only on one side of the sheet-shaped shielded cable 1101. FIG. 14 shows a case where the shielding conductor 1104 is not conductively connected to a ground wire 1116 of the cable. FIG. 15 shows a case where the shielding conductor 1104 is conductively connected to the ground wire 1116 of the cable.

Figure 16:
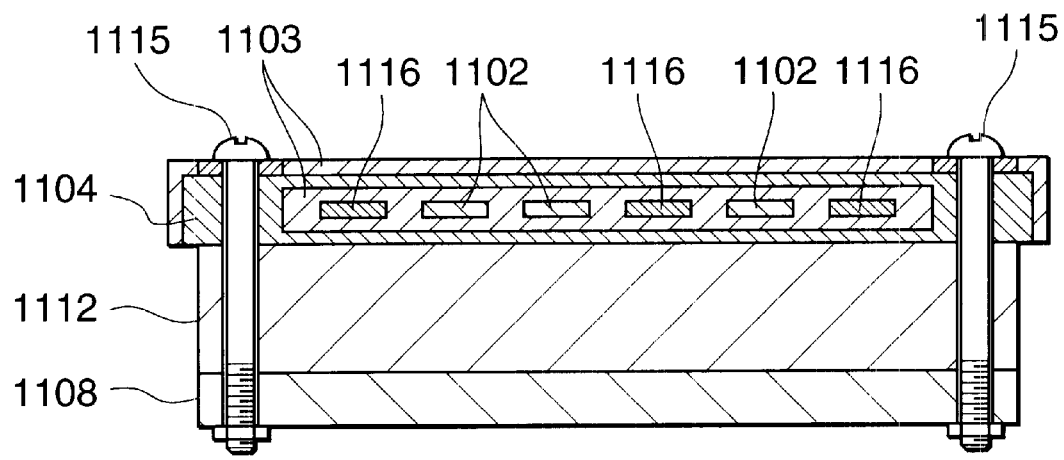
FIG. 16 is a sectional view showing the example of cable connection in the electronic apparatus according to the eleventh embodiment.
Figure 17:
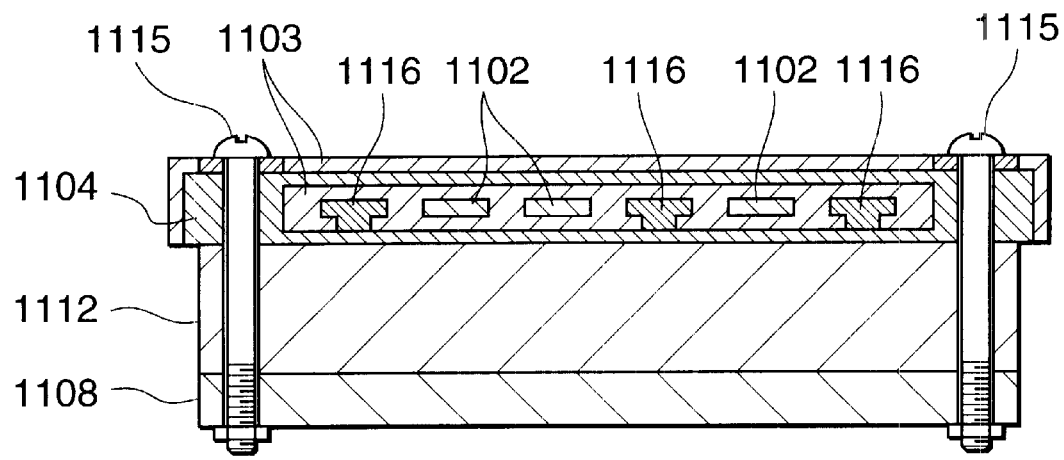
FIG. 17 is a sectional view showing the example of cable connection in the electronic apparatus according to the eleventh embodiment.

FIGS. 16 and 17 are views showing cases where the shielding conductor 1104 is provided on both sides of the sheet-shaped shielded cable 1101 in a manner covering the signal line. FIG. 16 shows a case where the shielding conductor 1104 is not conductively connected to the ground wire 1116 of the cable. FIG. 17 shows a case where the shielding conductor 1104 is conductively connected to the ground wire 1116 of the cable.

Thus, according to the eleventh embodiment of the present invention, by employing the cable connection structure in which the position of the shielded cable 1101 can be adjusted by means of the threaded holes 1113 provided in the shielding conductor 1104, in transmitting a signal via the flexible sheet-shaped shielded cable 1101 from the driver board 1105 to the receiver board 1106 in the electronic apparatus, the present invention provides the effect that radiated electromagnetic waves from the sheet-shaped shielded cable 1101 or the circuit boards 1105, 1106 due to resonance can be effectively suppressed in an inexpensive and simple manner.

[Twelfth Embodiment]

Figure 18:
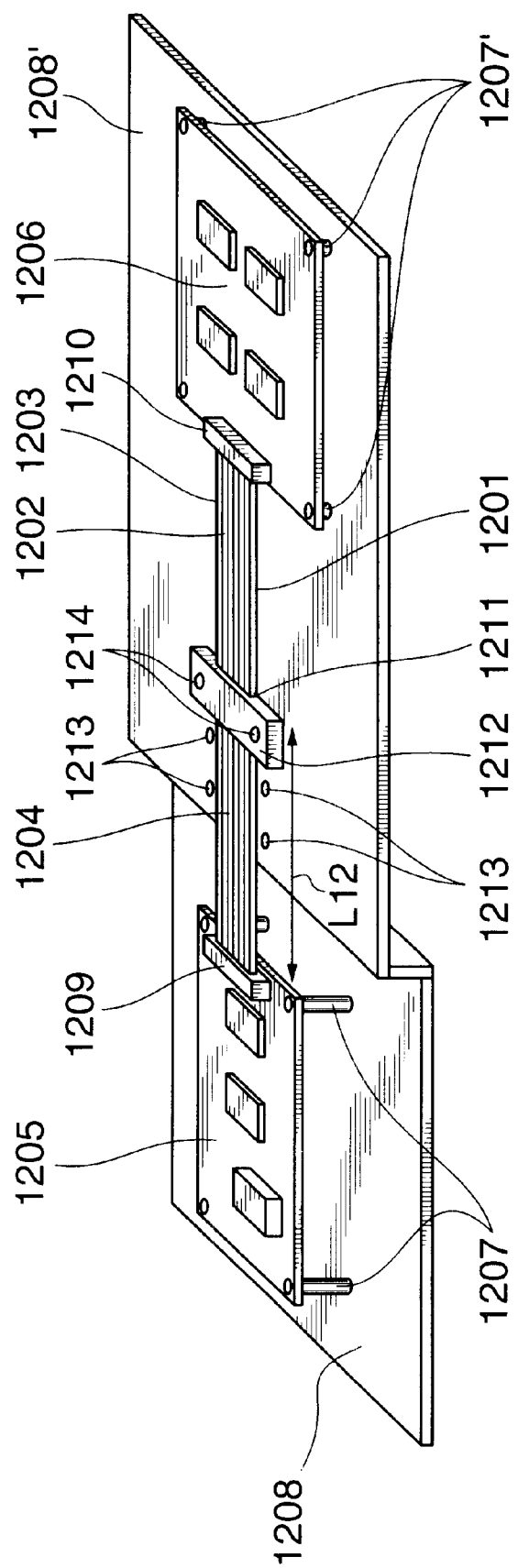
FIG. 18 is a perspective view showing a cable connection structure of an electronic apparatus according to a twelfth embodiment of the present invention.

FIG. 18 is a perspective view showing a cable connection structure of an electronic apparatus according to a twelfth embodiment of the present invention. As shown in FIG. 18, a flexible sheet-shaped shielded cable 1201 according to the twelfth embodiment is comprised of a signal line 1202, a dielectric material 1203, and a flexible shielding conductor 1204 formed in one body with the signal line 1202 and the shielding conductor 1204. The shielding conductor 1204 serves as ground and a shield. The sheet-shaped shielded cable 1201 connects two circuit boards 1205, 1206 to each other, and transmits signals between these circuit boards 1205, 1206.

The circuit board 1205 on the signal transmitting side will be referred to as the driver board, and the circuit board 1206 on the signal receiving side will be referred to as the receiver board. The sheet-shaped shielded cable 1201 and the driver board 1205 are connected to each other by a connector 1209, and the sheet-shaped shielded cable 1201 and the receiver board 1206 are connected to each other by a connector 1210. The ground of the driver board 1205 is conductively connected to a metal casing 1208 in the electronic apparatus via metal spacers 1207, and the ground of the receiver board 1206 is conductively connected to a metal casing 1208' in the electronic apparatus via metal spacers 1207'. Although the metal casings 1208 and 1208' are formed in one body, the metal casing 1208' is at a higher level than the metal casing 1208. In other words, the distance between the sheet-shaped shielded cable 1201 and the metal casing 1208' is shorter than the distance between the sheet-shaped shielded cable 1201 and the metal casing 1208.

The shielding conductor 1204 of the sheet-shaped shielded cable 1201 is conductively connected to the metal casing 1208' by a conductive connection member 1212. The conductive connection member 1212 is fixed to the shielding conductor 1204 and the metal casing 1208' by means of conductive screws 1214. The position of the conductive connection member 1212 can be adjusted using a plurality of threaded holes 1213 provided in the metal casing 1208'. The range of adjustable length L12 from the position where the shielding conductor 1204 is connected to the connector 1209 to the connecting position 1211 where the shielding conductor 1204 and the metal casing 1208' are connected to each other by the conductive connection member 1212 is set to a value obtained by multiplying $1/32$ to $7/16$ of the wavelength at the upper limit frequency of the relevant radiated electromagnetic waves emitted by the sheet-shaped shielded cable 1201 or $1/32$ to $7/16$ of the wavelength at the regulated upper limit frequency of the radiated electromagnetic waves by the wavelength reduction ratio at the shielding conductor 1204 of the shielded cable 1201.

The method of adjusting the position of the conductive connection member 1212 is not limited to the position adjustment by means of the threaded holes 1213 formed in the metal casing 1208' as described above. A plurality of slits may be formed in the metal casing 1208' and the position of the conductive connection member 1212 may be adjusted by means of the slits. The shape of the shielded cable is not limited to the shape of a sheet, and a shielded cable having a circular cross section may be employed.

As described above, the distance between the sheet-shaped shielded cable 1201 and the metal casing 1208 at an area from the driver board 1205 to the conductive connection member 1212 is set to be greater than the distance between the shielded cable 1201 and the metal casing 1208' at an area from the conductive connection member 1212 to the receiver board 1206, so that the characteristic impedance of the shielding conductor 1204 relative to the corresponding portions of the metal casings 1208 and 1208' is increased. This results in an increased input impedance of the shielding conductor 1204 at the connector 1209 relative to the metal casings 1208 and 1208'.

FIGS. 19, 20, 21, and 22 are cross-sectional views showing several variations of the state of the flexible sheet-shaped shielded cable 1201 according to the twelfth embodiment of the present invention as connected to the metal casing 1208 by the conductive connection member 1212.

Figure 19:
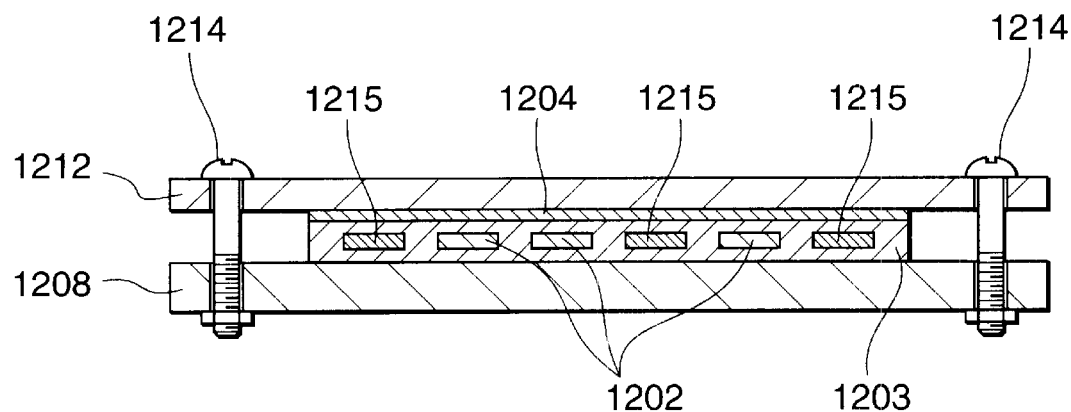
FIG. 19 is a sectional view showing the example of cable connection in the electronic apparatus according to the twelfth embodiment.
Figure 20:
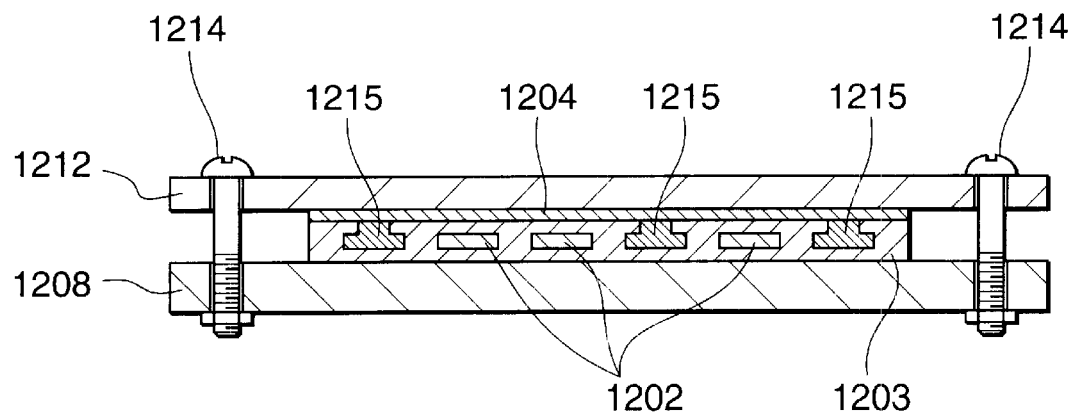
FIG. 20 is a sectional view showing the example of cable connection in the electronic apparatus according to the twelfth embodiment.

FIGS. 19 and 20 are views showing cases where the shielding conductor 1204 is provided only on one side of the sheet-shaped shielded cable 1201. FIG. 19 shows a case where the shielding conductor 1204 is not conductively connected to the ground wire 1215 of the shielded cable 1201. FIG. 20 shows a case where the shielding conductor 1204 is conductively connected to the ground wire 1215 of the shielded cable 1201.

Figure 21:
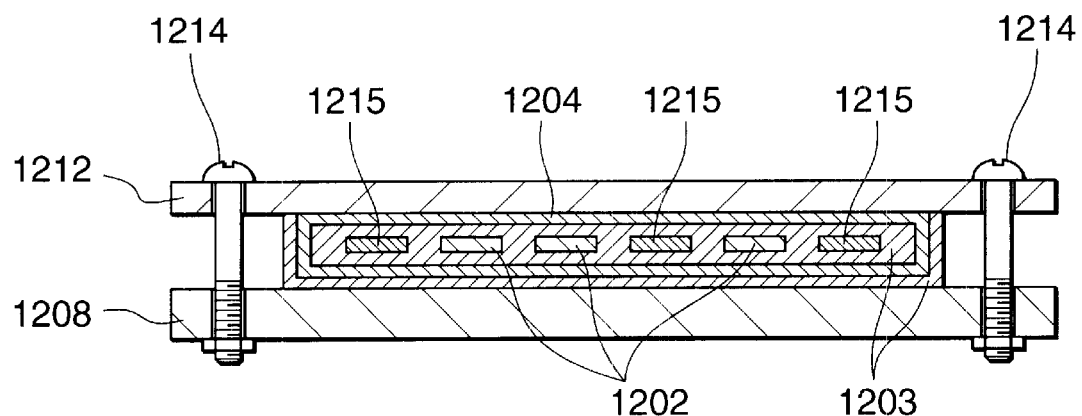
FIG. 21 is a sectional view showing the example of cable connection in the electronic apparatus according to the twelfth embodiment.
Figure 22:
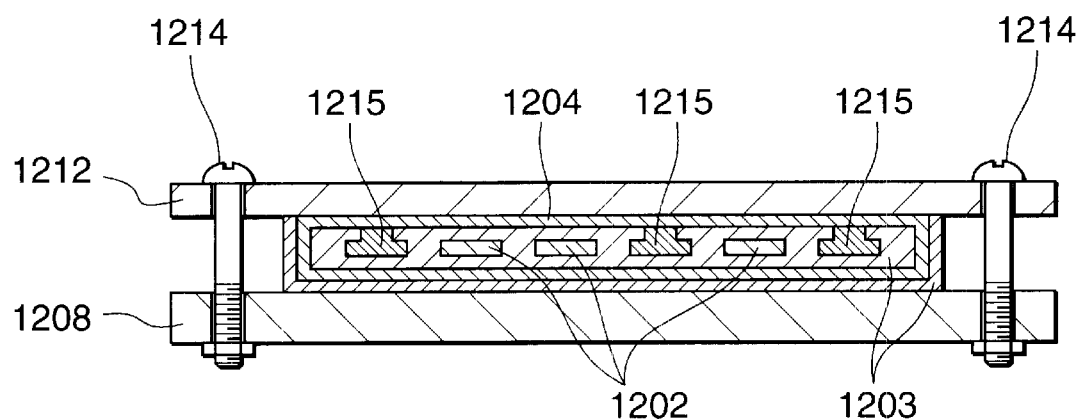
FIG. 22 is a sectional view showing the example of cable connection in the electronic apparatus according to the twelfth embodiment.

FIGS. 21 and 22 are views showing cases where the shielding conductor 1204 is provided on both sides of the sheet-shaped shielded cable 1201 in a manner covering the signal line 1202. FIG. 21 shows a case where the shielding conductor 1204 is not conductively connected to the ground wire 1215 of the sheet-shaped shielded cable 1201. FIG. 22 shows a case where the shielding conductor 1204 is conductively connected to the ground wire 1215 of the sheet-shaped shielded cable 1201.

Thus, by employing the cable connection structure according to the twelfth embodiment of the present invention, in transmitting a signal via the flexible sheet-shaped shielded cable 1201 from the driver board 1205 to the receiver board 1206 in the electronic apparatus, the present invention provides the effect that radiated electromagnetic waves from the sheet-shaped shielded cable 1201 or the circuit boards 1205, 1206 due to resonance can be effectively suppressed in an inexpensive and simple manner.

[Other Embodiments]

(1) In each of the above described embodiments of the present invention, the present invention has been described as being applied to a cable connection structure. However, the present invention is not limited to such a cable connection structure, but may equally be applied to an electronic apparatus having the cable connection structure of the present invention (for example, an information processing apparatus such as a computer, a workstation, and a portable information terminal, an image reading apparatus such as a scanner, an image forming apparatus such as a printer, a copying machine, a MFP, an image communicating apparatus such as a facsimile, and an image pickup apparatus such as a digital camera).

(2) The present invention is not limited to the above described embodiments in which the present invention is applied to cable connection structures. The present invention may equally be applied to a system (for example, an information processing system, an image reading system, an image forming system, an image communication system, and an image recording system) which is constructed of a plurality of electronic apparatus having the cable connection structure of the present invention (for example, an information processing apparatus such as a computer, a workstation, and a portable information terminal, an image reading apparatus such as a scanner, an image forming apparatus such as a printer, a copying machine, a MFP, an image communicating apparatus such as a facsimile, and an image pickup apparatus such as a digital camera).

What is claimed is:

1. A cable connection structure for use in an electronic apparatus, comprising:
    at least two circuit boards;
    at least two connectors provided on said circuit boards, respectively; and
    a shielded cable connecting said circuit boards to each other via said connectors, said shielded cable having a shielding conductor as a covering;
    wherein said shielding conductor is conductively connected to a metal casing at a position spaced from a position where said shielding conductor and one of said connectors are connected to each other by a distance which is set to a value obtained by multiplying $1/32$ to $7/16$ of a wavelength at an upper limit frequency of relevant radiated electromagnetic waves emitted from said shielded cable or $1/32$ to $7/16$ of a wavelength at a regulated upper limit frequency of radiated electromagnetic waves by a wavelength reduction ratio at said shielding conductor.

2. A cable connection structure according to claim 1, wherein said circuit boards comprise a driver board that transmits signals, and a receiver board that receives signals, and wherein said shielding conductor is conductively connected to said metal casing at a position spaced from the position where said shielding conductor and one of said connectors which is provided on said driver board are connected to each other by a distance which is set to a value obtained by multiplying $1/32$ to $7/16$ of a wavelength at an upper limit frequency of relevant radiated electromagnetic waves emitted from said shielded cable or $1/32$ to $7/16$ of a wavelength at a regulated upper limit frequency of radiated electromagnetic waves by a wavelength reduction ratio at said shielding conductor.

3. A cable connection structure according to claim 1, wherein said shielded cable has a circular cross section.

4. A cable connection structure for use in an electronic apparatus, comprising:
    at least two circuit boards;
    at least two connectors provided on said circuit boards, respectively; and
    a shielded cable connecting said circuit boards to each other via said connectors, said shielded cable having a shielding conductor as a covering;
    wherein said shielding conductor is conductively connected to a metal casing at a position spaced from a position where said shielding conductor and one of said connectors are connected to each other by a distance within a range of 1 cm to 13 cm.

5. An electronic apparatus having a metal casing, and a cable connection structure comprising:
    at least two circuit boards;
    at least two connectors provided on said circuit boards, respectively; and
    a shielded cable connecting said circuit boards to each other via said connectors, said shielded cable having a shielding conductor as a covering;
    wherein said shielding conductor is conductively connected to a metal casing at a position spaced from a position where said shielding conductor and one of said connectors are connected to each other by a distance which is set to a value obtained by multiplying $1/32$ to $7/16$ of a wavelength at an upper limit frequency of relevant radiated electromagnetic waves emitted from said shielded cable or $1/32$ to $7/16$ of a wavelength at a regulated upper limit frequency of radiated electromagnetic waves by a wavelength reduction ratio at said shielding conductor.

6. An electronic apparatus having a metal casing, and a cable connection structure comprising:
    at least two circuit boards;
    at least two connectors provided on said circuit boards, respectively; and
    a shielded cable connecting said circuit boards to each other via said connectors, said shielded cable having a shielding conductor as a covering;
    wherein said shielding conductor is conductively connected to a metal casing at a position spaced from a position where said shielding conductor and one of said connectors are connected to each other by a distance within a range of 1 cm to 13 cm.

* * * * *

UNITED STATES PATENT AND TRADEMARK OFFICE
CERTIFICATE OF CORRECTION

PATENT NO. : 6,603,077 B2
DATED : August 5, 2003
INVENTOR(S) : Hirai

It is certified that error appears in the above-identified patent and that said Letters Patent is hereby corrected as shown below:

Column 1,
Line 65, "mounted" should read -- mounted on --.

Column 2,
Lines 2, 34 and 49, "above described" should read -- above-described --; and
Line 37, "in" should read -- on --.

Column 15,
Line 37, "above described" should read -- above-described --.

Column 24,
Line 66, "above described" should read -- above-described --.

Column 25,
Line 12, "above" should read -- above- --.

Signed and Sealed this

Fourth Day of January, 2005

JON W. DUDAS
*Director of the United States Patent and Trademark Office*